United States Patent

(12) United States Patent (10) Patent No.: US 8,907,561 B2
Ryu et al. (45) Date of Patent: Dec. 9, 2014

(54) DISPLAY DEVICE AND ORGANIC LIGHT EMITTING DIODE DISPLAY DEVICE

(75) Inventors: Do-Hyung Ryu, Yongin (KR); Chun-Seok Ko, Yongin (KR); Sang-Soo Kim, Yongin (KR)

(73) Assignee: Samsung Display Co., Ltd., Giheung-Gu, Yongin, Gyeonggi-Do (KR)

( * ) Notice: Subject to any disclaimer, the term of this patent is extended or adjusted under 35 U.S.C. 154(b) by 256 days.

(21) Appl. No.: 13/188,883

(22) Filed: Jul. 22, 2011

(65) Prior Publication Data

US 2012/0025700 A1 Feb. 2, 2012

(30) Foreign Application Priority Data

Jul. 28, 2010 (KR) ........................ 10-2010-0073023
Jun. 8, 2011 (KR) ........................ 10-2011-0055089

(51) Int. Cl.
*H01L 51/50* (2006.01)
*H01L 51/52* (2006.01)
*H01L 51/54* (2006.01)
*H05K 1/03* (2006.01)

(52) U.S. Cl.
CPC ......... *H01L 51/5287* (2013.01); *H01L 51/5246* (2013.01); *H01L 51/52* (2013.01); *H05K 1/0366* (2013.01)
USPC ........... 313/512; 313/506; 313/509; 313/317; 313/318.01

(58) Field of Classification Search
CPC .............. H05K 2201/0281; H05K 2201/0287; H05K 2201/026; H05K 1/0366; H05K 3/429; H05K 3/4623; H05K 10/00; H01L 2224/48237; H01L 23/373; H01L 23/49827; H01L 27/3276; H01L 2924/01006; H01L 51/0048; H01L 51/5246; H01L 51/52; H01L 51/5032; H01L 51/5287; H01L 51/50
USPC .............. 313/498–512, 317, 318.01, 318.05, 313/318.12
See application file for complete search history.

(56) References Cited

U.S. PATENT DOCUMENTS

2005/0179374 A1 8/2005 Kwak
2006/0250080 A1* 11/2006 Yamazaki et al. ............ 313/506

(Continued)

FOREIGN PATENT DOCUMENTS

CN 1921138 A 2/2007
EP 1109224 A2 6/2001

(Continued)

OTHER PUBLICATIONS

The extended European search report issued by the European Patent Office dated Jun. 15, 2013 in the examination of the European Patent Application No. 11175877.7, which corresponds to the Korean Patent Application No. 10-2010-0073023, that cited and interpreted EP1109224A2, and US2009095521A1.

*Primary Examiner* — Mariceli Santiago
*Assistant Examiner* — Jose M Diaz
(74) *Attorney, Agent, or Firm* — Robert E. Bushnell, Esq.

(57) ABSTRACT

An embodiment provides an organic light emitting diode display device that includes a substrate; a display unit formed on the substrate and including a common power supply line and a common electrode; a sealing substrate attached to the substrate by a bonding layer which surrounds the display unit, the sealing substrate including a resin base and a carbon fiber, and the sealing substrate including a first through-hole and a second through-hole; a first conductive unit formed on an inner surface and an outer surface of the sealing substrate through the first through-hole, and the first conductive unit supplying a first signal to the common power supply line; and a second conductive unit formed on both the inner surface and the outer surface of the sealing substrate through the second through-hole, and the second conductive unit supplying a second signal to the common electrode.

36 Claims, 17 Drawing Sheets

(56) References Cited

U.S. PATENT DOCUMENTS

| | | | |
|---|---|---|---|
| 2008/0111465 A1* | 5/2008 | Won et al. | 313/495 |
| 2008/0111469 A1* | 5/2008 | Jung et al. | 313/496 |
| 2008/0315748 A1* | 12/2008 | Kitada et al. | 313/477 HC |
| 2009/0095521 A1 | 4/2009 | Yokouchi et al. | |
| 2010/0157215 A1 | 6/2010 | Kurosaki et al. | |
| 2011/0007042 A1 | 1/2011 | Miyaguchi | |
| 2011/0083836 A1* | 4/2011 | Kobayashi | 165/185 |
| 2011/0291119 A1* | 12/2011 | Ryu et al. | 257/88 |
| 2012/0026074 A1* | 2/2012 | Lee et al. | 345/76 |
| 2012/0075261 A1* | 3/2012 | Ryu et al. | 345/204 |
| 2012/0091484 A1* | 4/2012 | Lee et al. | 257/91 |
| 2012/0104420 A1* | 5/2012 | Lee et al. | 257/88 |
| 2012/0104937 A1* | 5/2012 | Lee et al. | 313/504 |
| 2012/0153814 A1* | 6/2012 | Lee et al. | 313/504 |
| 2013/0092911 A1* | 4/2013 | Yamazaki et al. | 257/40 |

FOREIGN PATENT DOCUMENTS

| | | |
|---|---|---|
| JP | 05-205876 | 8/1993 |
| JP | 2001-052858 | 2/2001 |
| JP | 2004-111321 A | 4/2004 |
| JP | 2007-220569 | 8/2007 |
| KR | 10-2003-0083528 A | 10/2003 |
| KR | 10-2006-0089977 | 8/2006 |
| KR | 10-2007-0083124 | 8/2007 |
| KR | 10-2008-0043537 | 5/2008 |
| KR | 10-2009-0030139 A | 3/2009 |
| TW | 465122 | 11/2001 |
| TW | 200742144 | 11/2007 |

* cited by examiner

200

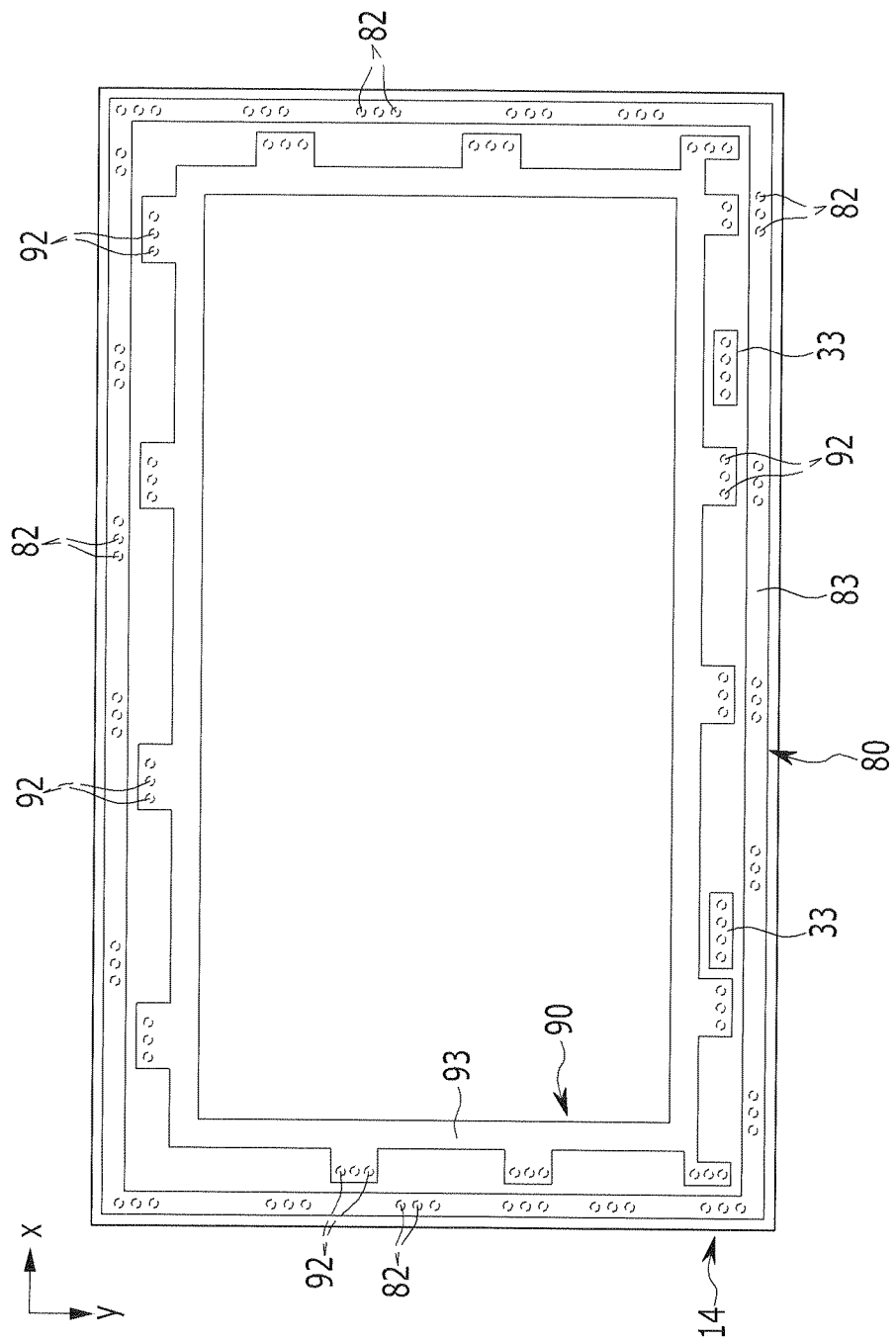

DISPLAY DEVICE AND ORGANIC LIGHT EMITTING DIODE DISPLAY DEVICE

CLAIM OF PRIORITY

This application makes reference to, incorporates the same herein, and claims all benefits accruing under 35 U.S.C. §119 from applications earlier filed in the Korean Intellectual Property Office on 28 Jul. 2010 and there duly assigned Serial No. 10-2010-0073023, and on 8 Jun. 2011 and there duly assigned Serial No. 10-2011-0055089.

BACKGROUND OF THE INVENTION

1. Field of the Invention

An embodiment of the present invention relates generally to a display device, and more particularly, to an organic light emitting diode display device. Further, an embodiment of the present invention relates generally to a sealing substrate sealing a display unit.

2. Description of the Related Art

A display device includes a flat type and self luminescent organic light emitting diode display device.

The organic light emitting diode display device includes an organic light emitting diode emitting light of itself to display an image. When a display unit including a plurality of organic light emitting diodes is exposed to moisture and oxygen, its function may deteriorate. Therefore, a technology of sealing the display unit to prevent the moisture and oxygen from permeating from the outside is required.

The above information disclosed in this Background section is only for enhancement of understanding of the background of the present invention and therefore it may contain information that does not form the prior art that is already known in this country to a person of ordinary skill in the art.

SUMMARY OF THE INVENTION

One aspect of the present invention has been made in an effort to provide a display device and an organic light emitting diode display device having advantages of improving a sealing function of a display unit.

An embodiment of the present invention provides a display device that includes a substrate; a display unit formed on the substrate; a sealing substrate fixed to the substrate by a bonding layer surrounding the display unit, the sealing substrate including a resin base and a plurality of carbon fibers and the sealing substrate including a through-hole; a metallic film positioned on one surface of the sealing substrate facing the substrate; and a conductive connector extending through the trough-hole and contacting the metallic film.

The plurality of carbon fibers may cross each other in the resin base. The sealing substrate may be constituted by a plurality of layers, and each of the plurality of layers may include the resin base and the carbon fiber. The carbon fiber disposed on at least one layer of the plurality of layers and the carbon fiber disposed on the other layer of the plurality of layers may cross each other.

The metallic film may include a plurality of metallic films which are spaced apart from each other, the connector may include a plurality of connectors corresponding to the plurality of metallic films, respectively, and each of the plurality of metallic films may be applied with different signals through a connector corresponding thereto among the plurality of connectors.

An insulating layer may be positioned on an inner surface of the sealing substrate and a side wall of the through-hole, and the plurality of metallic films and the plurality of connectors may be positioned on the insulating layer.

Each of the plurality of layers may be surrounded by the insulating layer and wire layers may be positioned among the plurality of layers. A plurality of electronic elements may be mounted on an outer surface of a layer which is positioned furthest from the display unit among the plurality of layers. At least two electronic elements of the plurality of electronic elements may be connected to each other through the wire layers, and at least one electronic element may be connected with the metallic film through the connector.

Another embodiment of the present invention provides an organic light emitting diode display device that includes a substrate; a display unit formed on the substrate and including a common power supply line and a common electrode; a sealing substrate attached to the substrate by a bonding layer which surrounds the display unit, the sealing substrate including a resin base and a carbon fiber and including a first through-hole and a second through-hole; a first conductive unit formed on an inner surface and an outer surface of the sealing substrate through the first through-hole and supplying a first signal to the common power supply line; and a second conductive unit formed on both the inner surface and the outer surface of the sealing substrate through the second through-hole and supplying a second signal to the common electrode.

The organic light emitting diode display device may further include an insulating layer formed on the inner surface and the outer surface of the sealing substrate, the side wall of the first through-hole, and the side wall of the second through-hole. The first conductive unit and the second conductive unit may be positioned on the insulating layer.

The second conductive unit may include a second internal layer which is in contact with the bonding layer on the inner surface of the sealing substrate and faces the display unit. The first conductive unit may include a first internal layer which is spaced apart from the second internal layer by a predetermined distance and is positioned outside of the second internal layer. The second internal layer may be formed by any one of an aluminum film, an aluminum alloy film, a copper film, and a copper alloy film.

The first conductive unit may further include a first connector which is in contact with the first internal layer while the first connector extends through the first through-hole and a first external layer which is in contact with the first connector and is positioned on the outer surface of the sealing substrate. The first external layer may be larger than the first internal layer in at least one of width and thickness.

The second conductive unit may further include a second connector which is in contact with the second internal layer while the second connector extends through the second through-hole and a second external layer which is in contact with the second connector and is positioned on the outer surface of the sealing substrate. The second external layer may be thicker than the second internal layer.

The common power supply line may include a first common power supply line and a second common power supply line which cross each other. The first conductive unit may include a third conductive unit which is connected with a first odd number-th common power supply line and a second odd number-th common power supply line to supply a third signal, and a fourth conductive unit which is connected with a first even number-th common power supply line and a second even number-th common power supply line to supply a fourth signal of the first common power supply line and the second common power supply line.

Yet another embodiment of the present invention provides an organic light emitting diode display device that includes a substrate; a display unit formed on the substrate and including a common power supply line and a common electrode; a pad section positioned outside of the display unit, and the pad section including a first pad section which is connected with the common power supply line and a second pad section which is connected with the common electrode; a sealing substrate attached to the substrate by a bonding layer which surrounds the display unit, the sealing substrate including a resin base and a carbon fiber, and the sealing substrate including a first through-hole and a second through-hole; a first conductive unit formed on an inner surface and an outer surface of the sealing substrate through the first through-hole and supplying a first signal to the common power supply line; a second conductive unit formed on both the inner surface and the outer surface of the sealing substrate through the second through-hole and supplying a second signal to the common electrode; and a conductive bonding layer positioned between the first pad section and the first conducive unit and between the second pad section and the second conductive unit to electrically connect the first pad section to the first conductive unit and to electrically connect the second pad section to the second conductive unit.

The common power supply line may include a first common power supply line and a second common power supply line which cross each other. The first pad section and the second pad section may be alternately and repetitively disposed in one direction of the substrate.

The conductive bonding layer may show electrical conductivity in a thickness direction, show electrical insulativity in directions other than the thickness direction, and may be overlapped with the first pad section and the second pad section.

The first conductive unit may include a first internal layer which is overlapped with the first pad section and is in contact with the conductive bonding layer, a first external layer positioned on the outer surface of the sealing substrate, and a first connector which extends through the first through-hole and connects the first internal layer and the first external layer with each other. The second conductive unit may include a second internal layer which is overlapped with the second pad section and is in contact with the conductive bonding layer, a second external layer positioned on the outer surface of the sealing substrate, and a second connector which extends through the second through-hole and connects the second internal layer and the second external layer with each other.

The second internal layer may extend to the center of the sealing substrate to face the display unit, and the first internal layer may be spaced apart from the second internal layer by a predetermined distance outside of the second internal layer.

The first external layer may be positioned at least three edges of the sealing substrate, and the second external layer may be positioned at the rest edges of the sealing substrate.

The first conductive unit may include a third conductive unit which is connected with a first odd number-th common power supply line and a second odd number-th common power supply line to supply a third signal to the first common power supply line and the second common power supply line, and a fourth conductive unit which is connected with a first even number-th common power supply line and a second even number-th common power supply line to supply a fourth signal to the first common power supply line and the second common power supply line.

The first pad section may include a third pad section connected with the first odd number-th common power supply line and the second odd number-th common power supply line, and a fourth pad section which is connected with the first even number-th common power supply line and the second even number-th common power supply line. The first through-hole may be divided into a third through-hole for the third conductive unit and a fourth through-hole for the fourth conductive unit.

The third conductive unit may include a third internal layer which is overlapped with the third pad section and is in contact with the conductive bonding layer, a third external layer positioned on the outer surface of the sealing substrate, and a third connector which connects the third internal layer and the third external layer with each other while extending through the third through-hole. The fourth conductive unit may include a fourth internal layer which is overlapped with the fourth pad section and is in contact with the conductive bonding layer, a fourth external layer positioned on the outer surface of the sealing substrate, and a fourth connector which connects the fourth internal layer and the fourth external layer with each other while extending through the fourth through-hole.

The second internal layer may extend to the center of the sealing substrate to face the display unit and the third internal layer, and the fourth internal layer may be positioned outside of the second internal layer. Any one of the third internal layer and the fourth internal layer may be positioned at four edges of the sealing substrate.

The third external layer may be positioned at four edges of the sealing substrate, and the fourth external layer may be positioned in parallel to the third external layer outside or inside of the third external layer. The second external layer may be positioned between the third external layer and the fourth external layer.

The organic light emitting diode display device may further include an insulating layer formed on the inner surface and the outer surface of the sealing substrate, the side wall of the first through-hole, and the side wall of the second through-hole. The first conductive unit and the second conductive unit may be positioned on the insulating layer.

Still another embodiment of the present invention provides an organic light emitting diode display device that includes a substrate; a display unit formed on the substrate and including a common power supply line and a common electrode; a sealing substrate attached to the substrate by a bonding layer which surrounds the display unit, the sealing substrate including a resin base and a carbon fiber, and the sealing substrate including a first through-hole and a second through-hole; a first pad section positioned outside of the display unit and connected with the common power supply line; a first conductive unit formed on an inner surface and an outer surface of the sealing substrate through the first through-hole and connected with the first pad section by a conductive bonding layer to supply a first signal to the common power supply line; and a second conductive unit formed on both the inner surface and the outer surface of the sealing substrate through the second through-hole and being in close contact with the common electrode to supply a second signal to the common electrode.

The second conductive unit may include a second internal layer which is in close contact with the common electrode, a second external layer positioned on the outer surface of the sealing substrate, and a second connector which extends through the second through-hole and connects the second internal layer and the second external layer with each other.

The common electrode may include a plurality of protrusions and the second internal layer may be in close contact with the protrusion. The organic light emitting diode display device may further include a plurality of spacers positioned below the common electrode, and the protrusions may be provided to correspond to the plurality of spacers.

The second internal layer may have a larger area than the display unit and the second internal layer may be formed by any one of an aluminum film, an aluminum alloy film, a copper film, and a copper alloy film.

The first conductive unit may include a first internal layer which is overlapped with the first pad section and is in contact with the conductive bonding layer, a first external layer positioned on the outer surface of the sealing substrate, and a first connector which extends through the first through-hole and connects the first internal layer and the first external layer with each other.

The organic light emitting diode display device may further include an insulating layer formed on the inner surface and the outer surface of the sealing substrate, the side wall of the first through-hole, and the side wall of the second through-hole. The first conductive unit and the second conductive unit may be positioned on the insulating layer.

According to the embodiments of the present invention, an organic light emitting diode display device may simplify the entire structure and manufacturing process by improving a sealing function of a display unit, increasing luminance uniformity of a screen while implementing the display unit having a large area, and reducing the number of components.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings in which like reference symbols indicate the same or similar components, wherein:

FIG. 15 is a plan view illustrating an outer surface of a sealing substrate in the organic light emitting diode display device constructed with the third embodiment.

DETAILED DESCRIPTION OF THE INVENTION

Figure 1:
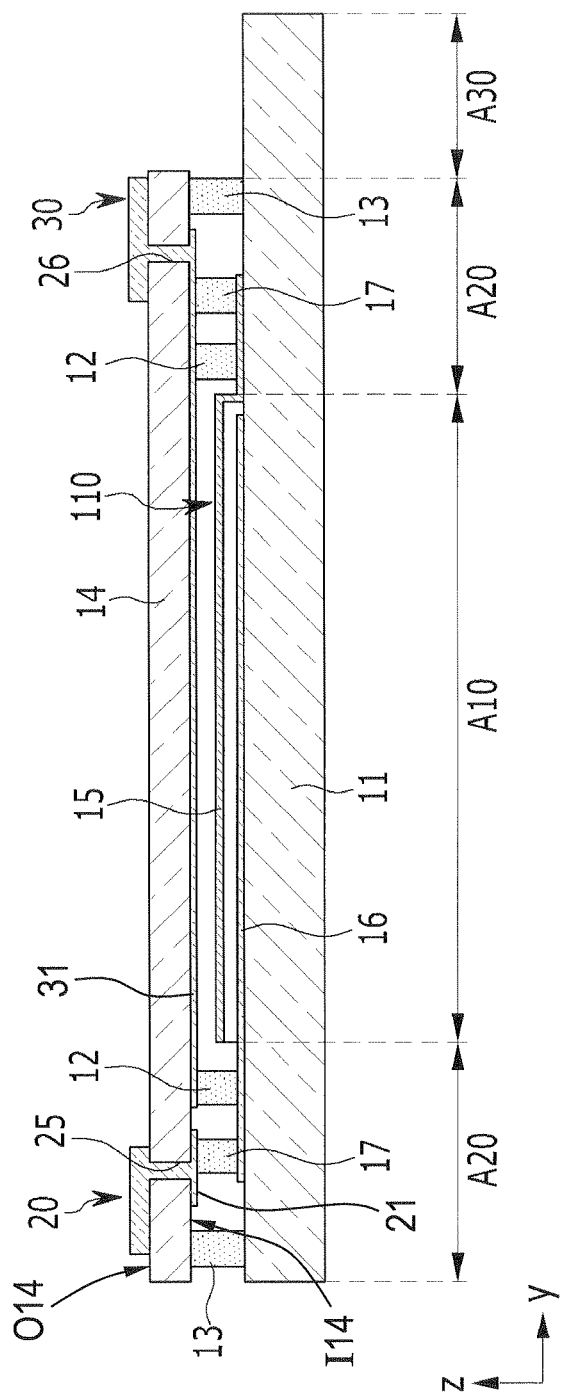
FIG. 1 is a schematic cross-sectional view of an organic light emitting diode display device constructed with a first embodiment.

The present invention will be described more fully hereinafter with reference to the accompanying drawings, in which exemplary embodiments of the invention are shown. As those skilled in the art would realize, the described embodiments may be modified in various different ways, all without departing from the spirit or scope of the present invention.

The drawings and description are to be regarded as illustrative in nature and not restrictive. Like reference numerals designate like elements throughout the specification. Sizes and thicknesses of components shown in the drawings are arbitrarily represented for better comprehension and ease of description and therefore, the present invention is not limited to the shown examples.

It will be understood that when an element such as a layer, film, region, or substrate is referred to as being "on" another element, it can be directly on the other element or intervening elements may also be present.

FIG. 1 is a schematic cross-sectional view of an organic light emitting diode display device constructed with a first embodiment.

Referring to FIG. 1, the organic light emitting diode display device 100 constructed with the first embodiment includes a substrate 11, a display unit 110 formed on the substrate 11, a sealing substrate 14 fixed to the substrate 11 by bonding layers 12 and 13 surrounding the display unit 110. The substrate 11 includes a display area A10 within which the display unit 110 is positioned and a nondisplay area positioned outside of the display area A10. The nondisplay area may be partitioned into a wire and sealing area A20 and a pad area A30.

The display unit 110 includes a plurality of pixels, and an organic light emitting diode and a driving circuit unit are formed in each pixel. The organic light emitting diode includes a pixel electrode and an organic emission layer, and a common electrode 15. The driving circuit unit is constituted by at least two thin film transistors including a switching thin film transistor and a driving thin film transistor and at least one capacitor.

Further, a gate line and a data line, and a common power supply line 16 are positioned in each pixel. The gate line transfers a scan signal and the data line transfers a data signal. The common power supply line 16 applies common voltage to the driving thin film transistor. The common power supply line 16 may be formed in parallel to the data line or may be constituted by a first common power supply line parallel to the data line and a second common power supply line parallel to the gate line.

A detailed structure of the display unit 110 will be described later; in FIG. 1, the display unit 110 with the common power supply line 16 and the common electrode 15 is schematically shown.

The bonding layers 12 and 13 include a first bonding layer 12 surrounding the display unit 110 and a second bonding layer 13 positioned outside of the first bonding layer 12. The second bonding layer 13 may surround the first bonding layer 12. In addition, an electrically conductive bonding layer 17 is positioned between the first bonding layer 12 and the second bonding layer 13.

The first bonding layer 12 and the second bonding layer 13 do not include an electrically conductive material and may be made of an inorganic material such as glass frit or resins. A thermosetting resin, i.e., an epoxy resin, a polyurethane resin, a phenol resin, a melamine resin, and an unsaturated polyester resin may be used to form the first bonding layer 12 and the second bonding layer 13. The materials of the first bonding layer 12 and the second bonding layers are not limited to the above-mentioned examples, but all materials having a sealing function and a bonding function may be adopted. A hygroscopic filler (not shown) may be positioned between the substrate 11 and the sealing substrate 14 inside of the first bonding layer 12.

In the organic light emitting diode display device 100 of the first embodiment, the common power supply line 16 and the common electrode 15 are not connected with a flexible printed circuit (not shown) attached to the pad area A30. Instead, the common power supply line 16 is electrically connected to a first conductive unit 20 formed on the sealing substrate 14 and is applied with a first signal from the first conductive unit 20; the common electrode 15 is electrically connected to a second conductive unit 30 formed on the sealing substrate 14 and is applied with a second signal from the second conductive unit 30.

Therefore, in the organic light emitting diode display device 100 constructed with the first embodiment, the corresponding signal may be uniformly applied to the common power supply line 16 and the common electrode 15 without forming the pad area A30 at all of upper and lower and left and right edges of the substrate 11 while the display unit 110 having the large area is implemented. As a result, it is possible to simplify the entire structure and manufacturing process of the organic light emitting diode display device 100 while luminance nonuniformity resulting from the manufacturing of the display unit 110 having the large area may be prevented.

Figure 2:
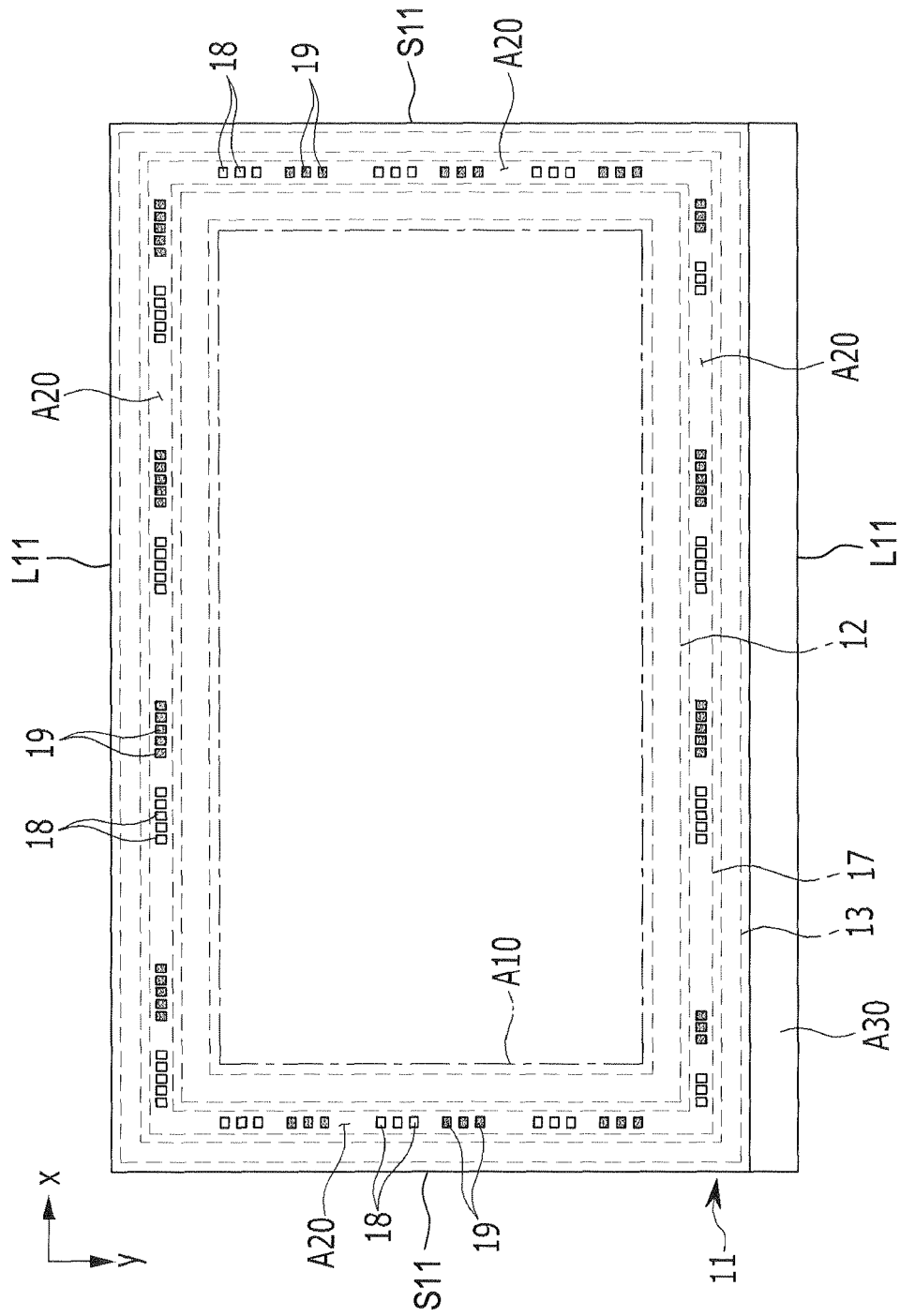
FIG. 2 is a plan view of a substrate in the organic light emitting diode display device shown in FIG. 1.

FIG. 2 is a plan view of a substrate in the organic light emitting diode display device shown in FIG. 1.

Referring to FIGS. 1 and 2, the substrate 11 is formed in a rectangular shape having a pair of long sides and a pair of short sides and the wire and sealing area A20 is positioned outside of four edges of the display area. A10. The sealing area A20 may surround the display area A10. The first bonding layer 12, the conductive bonding layer 17, and the second bonding layer 13 are positioned in the wire and sealing area A20. In addition, the pad area A30 is positioned at any one edge of the substrate 11 outside of the wire and sealing area A20.

In FIG. 2, the pad area A30 is positioned on a lower long side of the substrate 11, but the position of the pad area A30 is not limited to the shown example.

A first pad section 18 electrically connected with the common power supply line 16 of the display unit 110 and a second pad section 19 electrically connected with the common electrode 15 of the display unit 110 are positioned in the wire and sealing area A20. The first pad section 18 and the second pad section 19 are formed in all of four wire and sealing areas A20, and the first pad section 18 and the second pad section 19 may be alternately and repetitively disposed in a horizontal direction (x-axis direction of the figure) and in a vertical direction (y-axis direction of the figure) of the substrate 11.

In FIG. 2, the second pad section 19 is displayed with a dot pattern in order to discriminate the first pad section 18 and the second pad section 19 from each other. A first pad section 18 positioned on the long side L11 of the substrate 11 among the plurality of first pad sections 18 may be electrically connected with a first common power supply line, and a first pad section 18 positioned on the short side S11 of the substrate 11 may be electrically connected with a second common power supply line. The first pad section 18 and the second pad section 19 shown in FIG. 2 are schematized and the positions and the number thereof are not limited to the shown example.

The first pad section 18 and the second pad section 19 are formed at positions corresponding to the conductive bonding layer 17. At this time, the conductive bonding layer 17 shows electrical conductivity only in a thickness direction (z-axis direction of the figure) and does not show electrical conductivity in other directions. Therefore, even though one conductive bonding layer 17 is in contact with both the first pad section 18 and the second pad section 19, the first pad section 18 and the second pad section 19 are not short-circuited from each other.

As such when the conductive bonding layer 17 formed by a single member is provided, a bonding process of the substrate 11 and the sealing substrate 14 using the first and second bonding layers 12 and 13 and the conductive bonding layer 17 may be simplified. Therefore, the manufacture of the organic light emitting diode display device 100 may be simplified.

In another embodiment, a conductive bonding layer having electrical conductivity in all directions may be used. In this case, the conductive bonding layer 17 may be divided into a first conductive bonding layer (not shown) positioned to correspond to the first pad section 18 and a second conductive bonding layer (not shown) corresponding to the second pad section 19. At this time, the first conductive bonding layer and the second conductive bonding layer are spaced apart from each other by a predetermined distance so as to be prevented from being short-circuited from each other.

Figure 3:
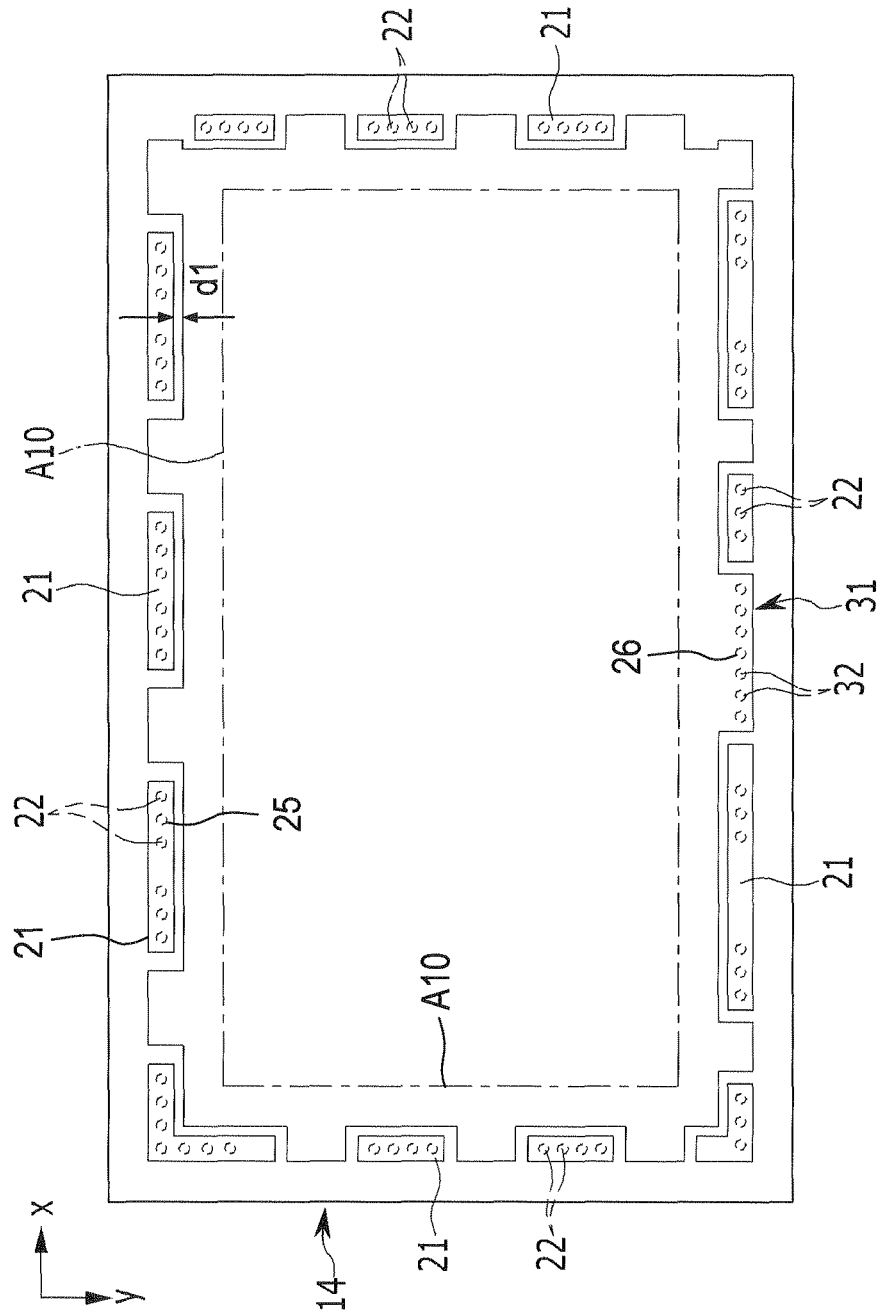
FIG. 3 is a plan view illustrating an inner surface of a sealing substrate in the organic light emitting diode display device shown in FIG. 1.
Figure 4:
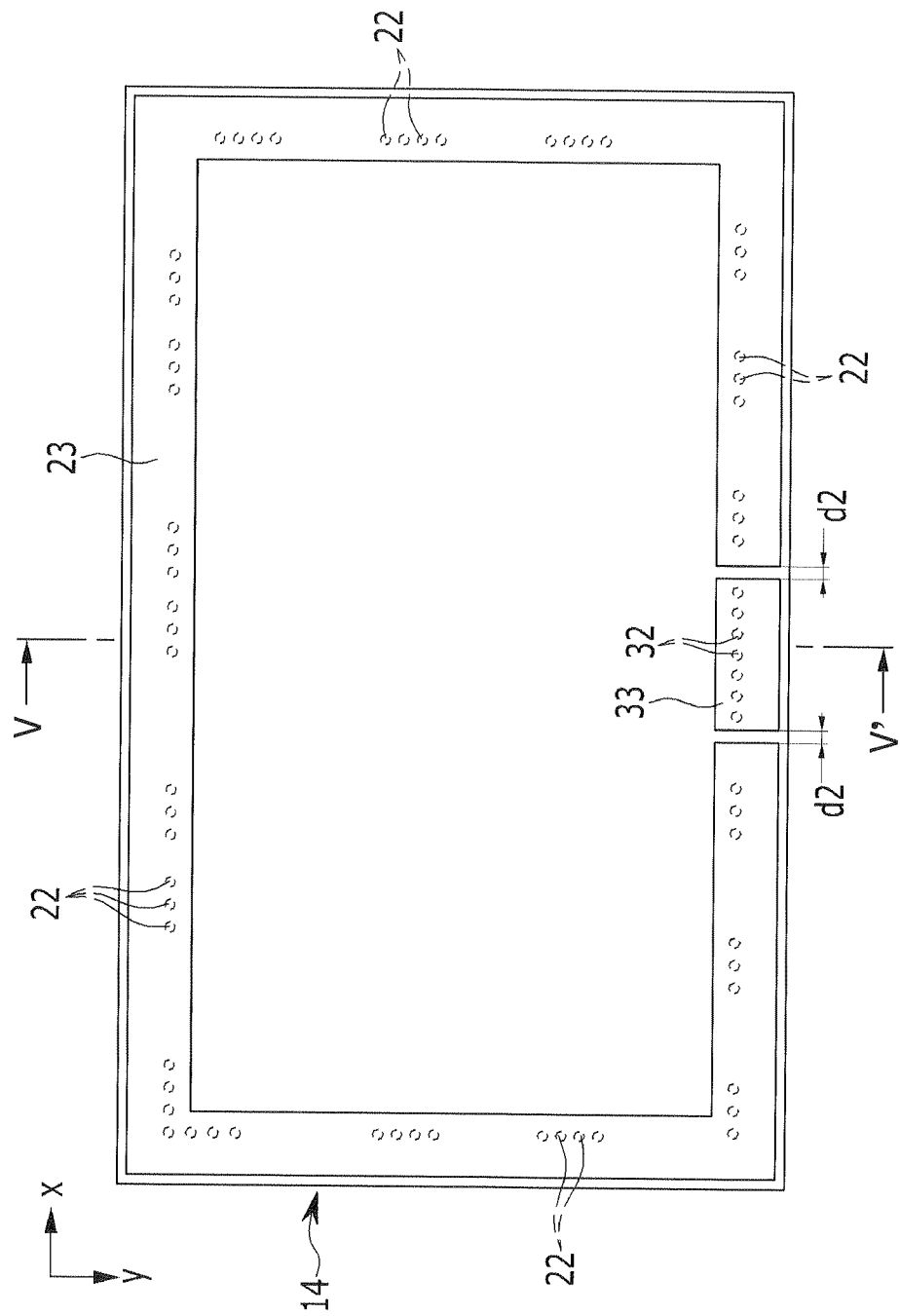
FIG. 4 is a plan view illustrating an outer surface of a sealing substrate in the organic light emitting diode display device shown in FIG. 1.
Figure 5:
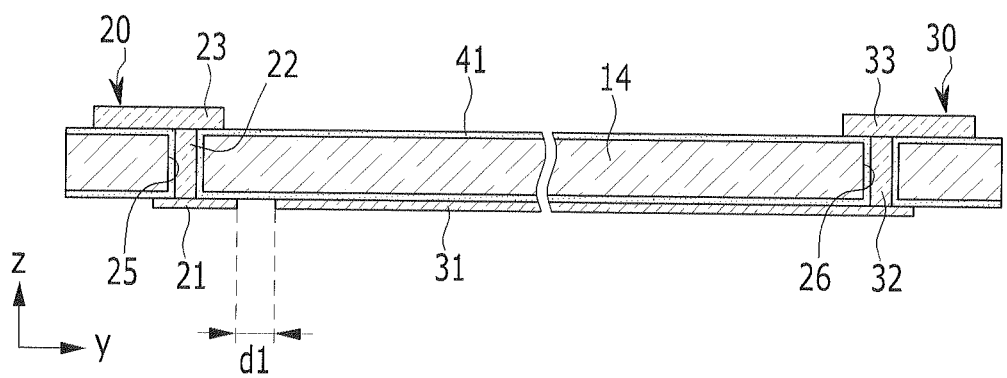
FIG. 5 is a cross-sectional view taken along line V-V' of FIG. 4.

FIGS. 3 and 4 are plan views respectively illustrating an inner surface 114 and an outer surface O14 of the sealing substrate 14 in the organic light emitting diode display device shown in FIG. 1 and FIG. 5 is a cross-sectional view taken along line V-V' of FIG. 4.

Referring to FIGS. 1 to 5, the sealing substrate 14 has a size to cover the display area A10 and four wire and sealing areas A20 of the substrate 11. Therefore, the pad area A30 of the substrate 11 is not overlapped with the sealing substrate 14 and is exposed to the outside of the sealing substrate 14.

In the sealing substrate 14, a first through-hole 25 for applying a signal of the common power supply line 16 and a second through-hole 26 for applying a signal of the common electrode 15 are formed. In addition, the first conductive unit 20 is formed throughout the inner surface of the sealing substrate 14 and the outer surfaces of the first through-hole 25 and the sealing substrate 14, and the second conductive unit 30 is formed throughout the inner surface 14 of the sealing substrate 14 and the outer surfaces of the second through-hole 26 and the sealing substrate 14. The first through-hole 25 and the second through-hole 26 may be formed at positions facing the wire and sealing area A20.

The first conductive unit 20 includes a first internal layer 21 formed on the inner surface of the sealing substrate 14, a first connector 22 which is in contact with the first internal layer 21 and extends through the first through-hole 25, and a first external layer 23 which is in contact with the first connector 22 and is formed on the outer surface of the sealing substrate 14. The first external layer 23 serves as a pad section which is applied with the first signal of the common power supply line 16.

The second conductive unit 30 includes a second internal layer 31 formed on the inner surface of the sealing substrate 14, a second connector 32 which is in contact with the second internal layer 31 and extends through the second through-hole 26, and a second external layer 33 which is in contact with the second connector 32 and is formed on the outer surface of the sealing substrate 14. The second external layer 33 serves as a pad section which is applied with the second signal of the common electrode 15.

The entirety of the first conductive unit 20 and the entirety of the second conductive unit 30 may be made of an electrically conductive material, and the first conductive unit 20 and the second conductive unit 30 may be disposed space apart from each other to be prevented from being short-circuited from each other. That is, the first internal layer 21 and the second internal layer 31 are space apart from each other on the inner surface of the sealing substrate 14 by a distance d1 (see FIGS. 3 and 5) and the first external layer 23 and the second external layer 33 are spaced apart from each other on the outer surface of the sealing substrate 14 by a distance d2 (see FIG. 4).

The first internal layer 21 is overlapped with the first pad section 18 of the substrate 11 and is in contact with the conductive bonding layer 17. The second internal layer 31 is overlapped with the second pad section 19 of the substrate 11 and is in contact with the conductive bonding layer 17. At this time, the second internal layer 31 extends to the center of the sealing substrate 14 to face the display unit 110, and the second internal layer 31 is overlapped with the first bonding layer 12. The second internal layer 31 may be formed by a single member, and the first internal layer 21 may be divided into plural numbers. The first internal layer 21 is positioned outside of the second internal layer 31 to be spaced apart from the second internal layer 31.

The second internal layer 31 is formed by a metallic film having low resistance and excellent moisture and oxygen interception effects. For example, the second internal layer 31 may be formed by an aluminum film an aluminum alloy film, a copper film, or a copper alloy film. Further, the second internal layer 31 may be formed by metallic foil including aluminum or copper.

The second internal layer 31 may be in close contact with the first bonding layer 12 to protect the display unit 110 and prevents moisture and oxygen from permeating from the outside. The second internal layer 31 may be in directly physical contact with the first bonding layer 12. Therefore, in the organic light emitting diode display device 100 of the first embodiment, the second internal layer 31 serves as a metal encapsulation which seals the display unit 110.

The first external layer 23 may be formed at three or more edges of the sealing substrate 14 and the second external layer 33 may be formed at the rest edges of the sealing substrate 14. In FIG. 4, the second external layer 33 is positioned at a part of any one long-side edge of the sealing substrate 14 and the first external layer 23 is positioned at the entirety of the rest edge of the sealing substrate 14. However, shapes of the first external layer 23 and the second external layer 33 are not limited to the shown example and may be variously modified.

An external connection terminal (not shown) is attached to the first external layer 23 and the second external layer 33. As a result, the first external layer 23 is applied with the first signal of the common power supply line 16 from the external connection terminal, and the first external layer 23 transfers the corresponding first signal to the first internal layer 21; the second external layer 33 is applied with the second signal of the common electrode 15 from the external connection terminal, and the second external layer 33 transfers the corresponding second signal to the second internal layer 31.

At this time, the first external layer 23 may be larger than the first internal layer 21 in at least one of width and thickness, and the second external layer 33 may be formed thicker than the second internal layer 31. In all cases, the first internal layer 21 and the second internal layer 31 have the same thickness as each other, and the first external layer 23 and the second external layer 33 have the same thickness as each other to prevent a step from being generated in a bonding process of the substrate 11 and the sealing substrate 14. The above-mentioned structure may be usefully applied to the organic light emitting diode display device having a large current and a large area.

In the organic light emitting diode display device 100, since the substrate 11 is subjected to dozens of heat-treatment processes for forming a driving circuit unit and an organic light emitting diode thereon, glass or polymer resin having a low thermal expansion coefficient is used. The sealing substrate 14 is manufactured by a resin base and a carbon composite material including a plurality of carbon fibers. The sealing substrate 14 may have substantially the same thermal expansion coefficient as the thermal expansion coefficient of the substrate 11 by adjusting the amount of a carbon fiber and the amount of the resin base.

Therefore, when the substrate 11 and the sealing substrate 14 are bonded to each other by curing the first and second bonding layers 12 and 13 and the conductive bonding layer 17 at high temperature, the sealing substrate 14 is not bent because the substrate 11 has the same thermal expansion coefficient as the sealing substrate 14; after the substrate 11 and the sealing substrate 14 are bonded to each other, a bending problem does not occur in an environmental reliability test.

Meanwhile, the sealing substrate 14 manufactured by carbon composites has electrical conductivity. When the first conductive unit 20 and the second conductive unit 30 are directly formed on the surface of the sealing substrate 14, the first conductive unit 20 and the second conductive unit 30 are short-circuited from each other through the sealing substrate 14. Therefore, as shown in FIG. 5, an electrically insulating layer 41 is formed on the inner surface and the outer surface of the sealing substrate 14, the side wall of the first through-hole 25, and the side wall of the second through-hole 26 are formed to prevent the first conductive unit 20 and the second conductive unit 30 from being short-circuited from each other.

Figure 6:
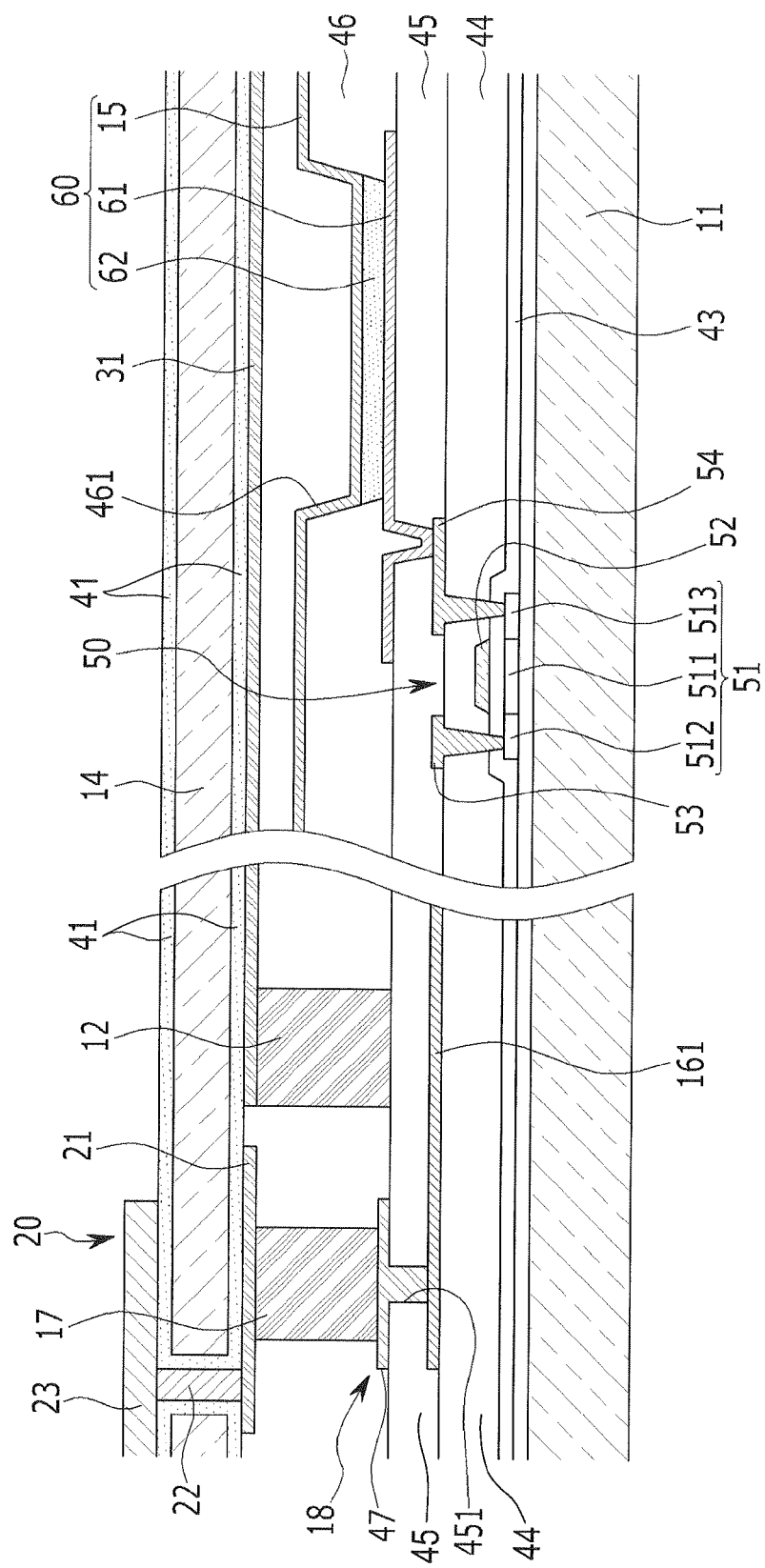
FIGS. 6 to 8 are partial enlarged cross-sectional views of an organic light emitting diode display device constructed with the first embodiment.
Figure 7:
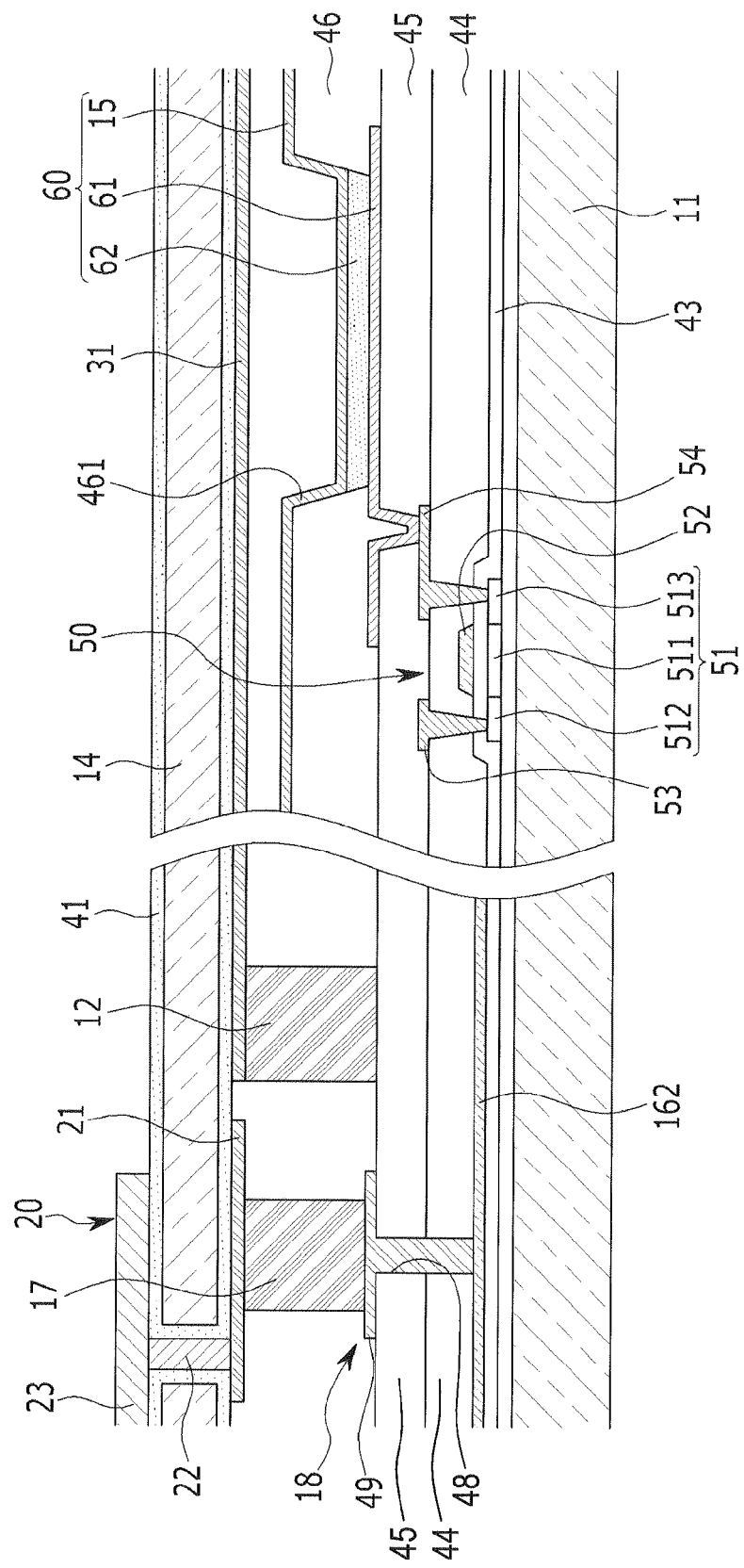
Figure 8:
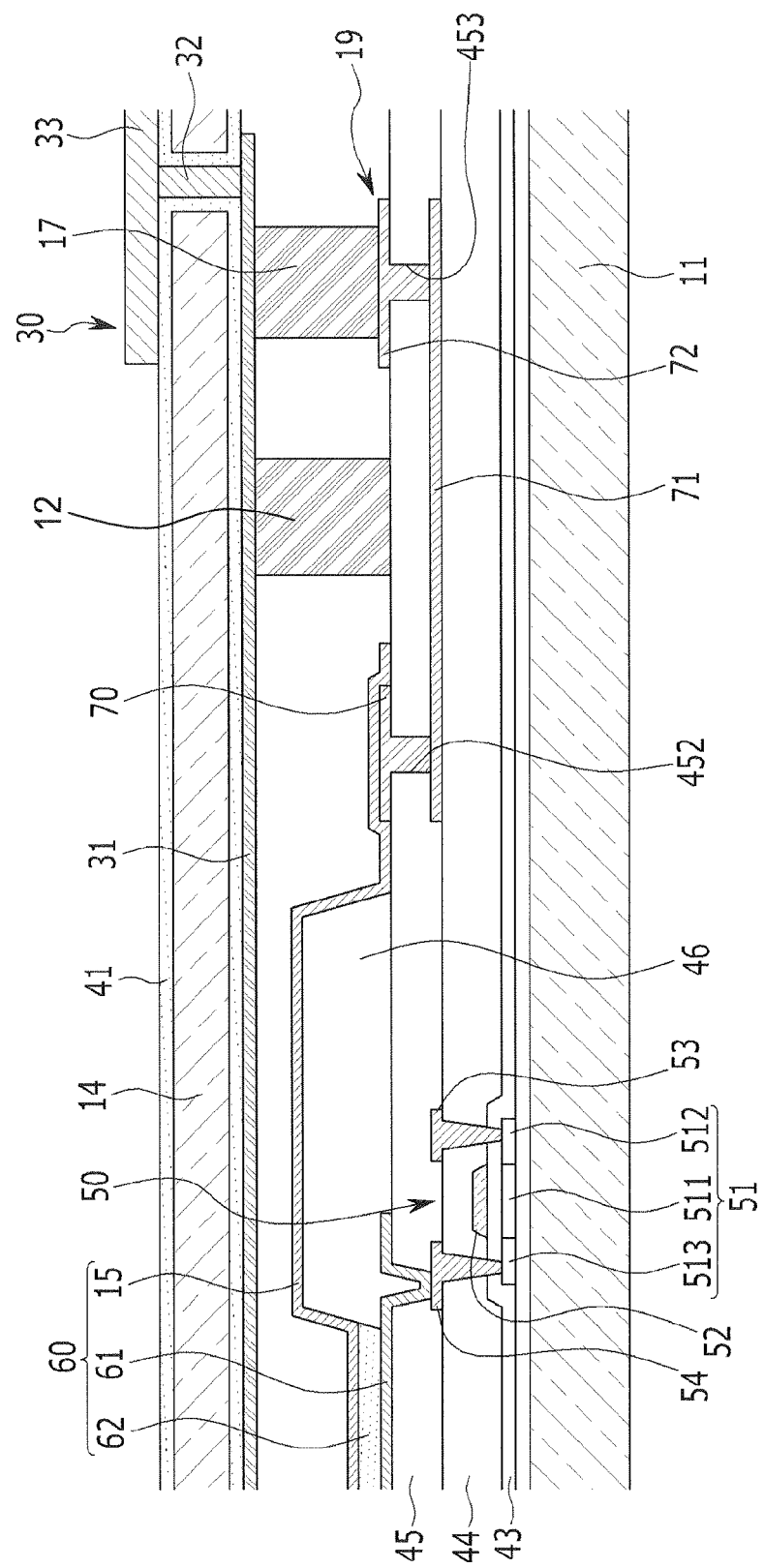

A detailed structure and constituent materials of the sealing substrate 14 will be described later. FIGS. 6 to 8 are partially enlarged cross-sectional views of an organic light emitting diode display device constructed with the first embodiment.

In FIG. 6, the first common power supply line and the first pad section are shown in detail; in FIG. 7, the second common power supply line and the first pad section are shown in detail. The first common power supply line may cross the second common power supply line. The first common power supply line and the second common power supply line may be respectively disposed in different layers. In addition, in FIG. 8, the common electrode and the second pad section are shown in detail.

Referring to FIGS. 6 to 8, the organic light emitting diode 60 and the driving circuit unit are formed in each pixel of the display unit as described above. The driving circuit unit is constituted by at least two thin film transistor and at least one capacitor. In FIGS. 6 to 8, it is schematically shown that one thin film transistor 50 and the one organic light emitting diode 60 are positioned in the display unit.

The thin film transistor 50 includes a semiconductor layer 51, a gate electrode 52, a source electrode 53, and a drain electrode 54. The semiconductor layer 51 is formed by a polycrystalline silicon film and includes a channel domain 511, a source domain 512, and a drain domain 513. The channel domain 511 is an intrinsic semiconductor undoped with impurities, and the source domain 512 and the drain domain 513 are impurity semiconductors doped with the impurities.

The gate electrode 52 is positioned on the channel domain 511 of the semiconductor layer 51 with a gate insulating layer 43 interposed therebetween. The source electrode 53 and the drain electrode 54 are positioned on the gate electrode 52 with an interlayer insulating layer 44 interposed therebetween and connected to the source domain 512 and the drain domain 513 through a contact hole formed on the interlayer insulating layer 44, respectively. A planarization layer 45 is formed on the source electrode 53 and the drain electrode 54 and a pixel electrode 61 is positioned on the planarization layer 45. The pixel electrode 61 is connected with the drain electrode 54 through a contact hole of the planarization layer 45.

A pixel defined layer 46 is positioned above the pixel electrode 61 and the planarization layer 45. The pixel defined layer 46 exposes a part of the pixel electrode 61 by forming a first opening 461 in each pixel. An organic emission layer 62 is formed above the exposed pixel electrode 61 and the common electrode 15 is formed in the entirety of the display area A10 to cover the organic emission layer 62 and the pixel defined layer 46. The pixel electrode 61, the organic emission layer 62, and the common electrode 15 constitute the organic light emitting diode 60.

The pixel electrode 61 may be a hole injection electrode and the common electrode 15 may be an electron injection electrode. In this case, the organic emission layer 62 includes a hole injection layer, a hole transporting layer, a light emitting layer, an electron transporting layer, and an electron injection layer that are sequentially laminated from the pixel electrode 61. Holes and electrons are injected into the organic emission layer 62 from the pixel electrode 61 and the common electrode 15 and when excitons formed by combining the injected holes and electrons with each other fall from an excited state to a ground state, light is emitted.

The pixel electrode 61 is formed by a transmissive conductive layer, and the common electrode 15 is formed by a reflective conductive layer. Light emitted from the organic emission layer 62 is reflected by the common electrode 15 and discharged to the outside through the substrate 11. Such an emission structure is called a bottom emission type. The pixel electrode 61 may be formed by triple layers of ITO, silver (Ag), and ITO and the common electrode 15 may include any one of silver (Ag), aluminum (Al), a silver alloy, and an aluminum alloy.

A first common power supply line 161 and a second common power supply line 162 may be formed on the same layer as any one electrode of the gate electrode 52, and the source and drain electrodes 53 and 54. In FIG. 6, the first common power supply line 161 may be formed on the same layer as and made of the same material as the source and drain electrodes 53 and 54; in FIG. 7, the second common power supply line 162 may be formed on the same layer as and made of the same material as the gate electrode 52.

Referring to FIGS. 6 and 7, the ends of the first common power supply line 161 and the second common power supply line 162 extend to the wire and sealing area A20. In addition, at least one insulating layer among four insulating layers formed in the display unit may extend to the wire and sealing area A20. The end of the first common power supply line 161 may be covered with the planarization layer 45 and the end of the second common power supply line 162 may be covered with the interlayer insulating layer 44 and the planarization layer 45. At least one of the first and second common power supply lines 161 and 162 may be formed in the OLED display device.

The planarization layer 45 exposes the end of the first common power supply line 161 by forming a second opening 451 and a first pad conductive layer 47 is formed on the planarization layer 45 to be electrically connected with the first common power supply line 161 through the second opening 451. The first pad section 18 positioned on the long side of the substrate 11 may be defined by the first pad conductive layer 47.

The interlayer insulating layer 44 and the planarization layer 45 expose the end of the second common power supply line 162 by forming a third opening 48 and a second pad conductive layer 49 is formed on the planarization layer 45 to be electrically connected with the second common power supply line 162 through the third opening 48. The first pad section 18 positioned on the short side of the substrate 11 may be defined by the second pad conductive layer 49.

The first pad conductive layer 47 of FIG. 6 and the second pad conductive layer 49 of FIG. 7 may be formed on the same layer as and made of the same material as the pixel electrode 61. Therefore, since an additional patterning process for forming the first and second pad conductive layers 47 and 49 may be omitted, it is possible to simplify a manufacturing process.

Referring to FIG. 8, the common electrode 15 is positioned inside of the first bonding layer 12 and the second pad section 19 is formed both inside and outside of the first bonding layer 12 to conduct the common electrode 15 and the conductive bonding layer 17.

The second pad section 19 includes a third pad conductive layer 70, a fourth pad conductive layer 71, and a fifth pad conductive layer 72. The third pad conductive layer 70 is positioned inside of the first bonding layer 12 and is in contact with the common electrode 15. The fourth pad conductive layer 71 is connected to the third pad conductive layer 70 through a fourth opening 452 of the planarization layer 45 and positioned both inside and outside of the first bonding layer 12. The fifth pad conductive layer 72 is positioned between the conductive bonding layer 17 and the planarization layer 45, and the fifth pad conductive layer 72 is connected with the fourth pad conductive layer 71 through a fifth opening 453 of the planarization layer 45.

The third pad conductive layer 70 and the fifth pad conductive layer 72 may be formed on the same layer as and made of the same material as the pixel electrode 61. In addition, the fourth pad conductive layer 71 may be formed on the same layer as and made of the same material as any one electrode of the gate electrode 52 and the source and drain electrodes 53 and 54. Therefore, since an additional patterning process for forming the second pad section 19 may be omitted, it is possible to simplify the manufacturing process.

In FIG. 8, the fourth pad conductive layer 71 is formed on the same layer as the source and drain electrodes 53 and 54 as an example. However, a detailed structure of the second pad section 19 is not limited to the shown example and all configurations capable of conducting the common electrode 15 of the display unit and the conductive bonding layer 17 of the wire and sealing area are applicable.

In the organic light emitting diode display device 100, the substrate 11 may be manufactured by transparent glass or transparent plastic having a low thermal expansion coefficient. The substrate 11 made of the transparent plastic may include any one of polyethersulfone, polyacrylate, polyetherimide, polyethylene, naphthalate, polyethylene terephtharate, polyphenylen sulfide, polyarylate, polyimide, polycarbonate, cellulose tri acetate, and cellulose acetate propionate.

A plurality of processes for forming a plurality of pixels on the substrate 11 are performed and since heat is applied during the processes, the substrate 11 is expanded by heat. Since the expansion of the substrate 11 reduces the durability of the organic light emitting diode display device 100 and the accuracy of the display area A10, a material having a low thermal expansion coefficient is selected at the time of selecting the material of the substrate 11. The substrate 11 made of the glass or plastic have thermal expansion coefficients in the range of approximately $3 \times 10^{-6}$/K to $4 \times 10^{-6}$/K.

Figure 9:
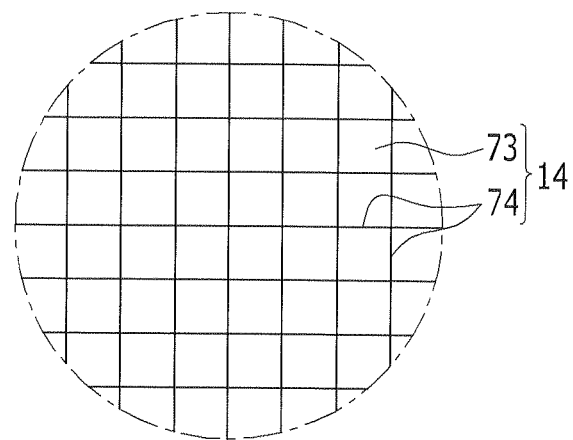
FIG. 9 is a schematic enlarged plan view of a part of a sealing substrate in the organic light emitting diode display device shown in FIG. 1.

FIG. 9 is a schematic enlarged plan view of a part of a sealing substrate in the organic light emitting diode display device shown in FIG. 1.

Referring to FIG. 9, the sealing substrate 14 is manufactured by a carbon composite material including a resin base 73 and a plurality of carbon fibers 74. The sealing substrate 14 may be formed by impregnating the plurality of carbon fiber 74 in the resin base 73.

The carbon fiber 74 has a lower thermal expansion coefficient than the substrate 11. In particular, the longitudinal thermal expansion coefficient of the carbon fiber 74 has a minus value. In contrast, the resin base 73 has a higher thermal expansion coefficient than the substrate 11. Therefore, it is possible to the thermal expansion coefficient of the sealing substrate 14 by adjusting the quantity of the carbon fiber 74 and the quantity of the resin base 73.

That is, when the sealing substrate 14 is manufactured by mixing the carbon fiber 74 and the resin base 73 with each other, the thermal expansion coefficient of the sealing substrate 14 and the thermal expansion coefficient of the substrate 11 may be controlled to be the same as or similar to each other by adjusting a ratio between the resin base 73 and the carbon fiber 74.

Since the carbon fiber 74 does not absorb moisture, the carbon fiber 74 improves the moisture permeation preventing performance of the sealing substrate 14. Further, since the sealing substrate 14 including the carbon fiber 74 has an excellent mechanical property, large mechanical rigidity may be implemented with small thickness. Therefore, it is possible to reduce the entire thickness of the organic light emitting diode display device 100. Further, the sealing substrate 14 serves to suppress the thermal expansion of the first internal layer 21 and the second internal layer 31.

The plurality of carbon fibers 74 cross each other, and for example, the carbon fibers 74 may have a pattern weaved by being tied with a longitudinal line and a latitudinal line. In FIG. 9, the carbon fibers 74 are perpendicular to each other, but the present invention is not limited thereto and the carbon fibers 74 may cross each other at angles other than the right angle. By the above-mentioned configuration, the sealing substrate 14 having a uniform and low thermal expansion coefficient may be formed in the entire area and the durability of the sealing substrate 14 may be improved.

Figure 10:
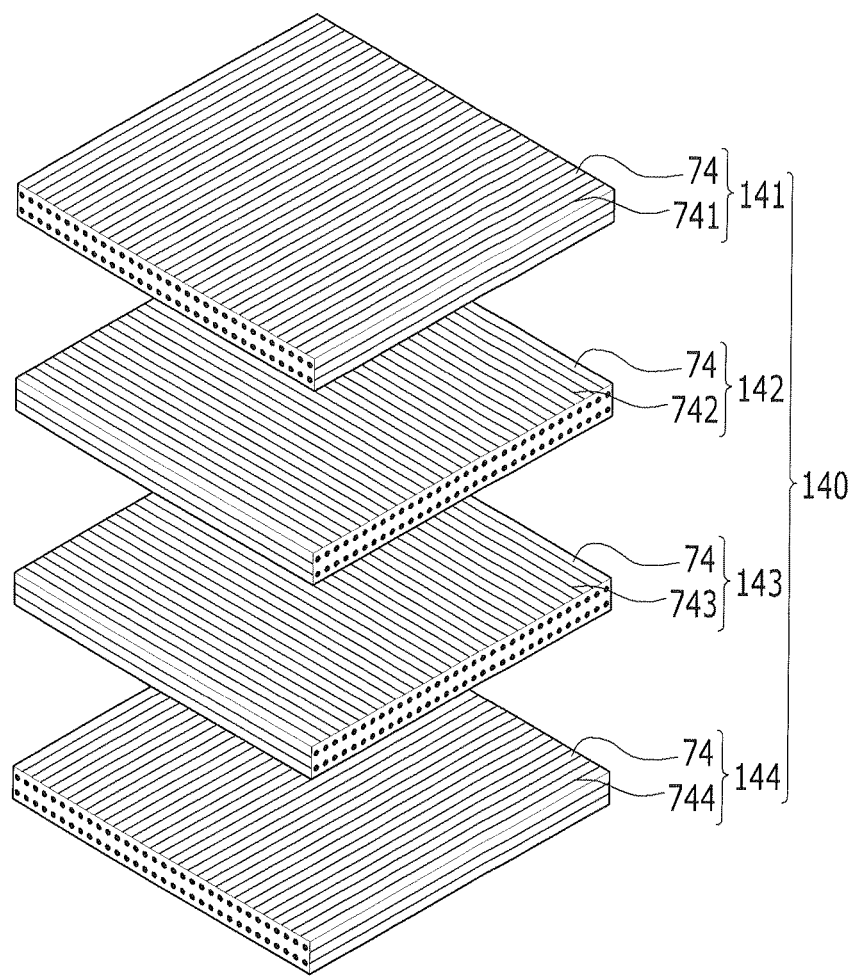
FIG. 10 as a modified example of FIG. 9 is an exploded perspective view illustrating a sealing substrate in the organic light emitting diode display device shown in FIG. 1.

FIG. 10 as a modified example of FIG. 9 is an exploded perspective view illustrating a sealing substrate 140 in the organic light emitting diode display device shown in FIG. 1.

Referring to FIG. 10, the sealing substrate 140 may be constituted by a plurality of layers. For example, the sealing substrate 140 may be configured in a lamination structure of a first layer 141, a second layer 142, a third layer 143, and a fourth layer 144. The layers 141, 142, 143, and 144 include the resin base 73 and the plurality of carbon fibers 741, 742, 743, and 744.

The carbon fibers 741 and 744 of the first layer 141 and the fourth layer 144 may be arranged in a first direction and the carbon fibers 742 and 743 of the second layer 142 and the third layer 143 may be arranged in a second direction. The first direction and the second direction may be perpendicular or not perpendicular to each other. In FIG. 10, the first direction and the second direction are perpendicular to each other as an example. When the plurality of carbon fibers 741, 742, 743, and 744 are arranged as above, it is possible to improve the flatness of the sealing substrate 140 by preventing the sealing substrate 140 from being twisted.

In order to adjust the thermal expansion coefficient of the sealing substrate 140, an angle between the arrangement direction of the carbon fibers 741 and 744 provided on the first layer 141 and the fourth layer 144 and the arrangement direction of the carbon fibers 742 and 743 provided on the second layer 142 and the third layer 143 may be variously set. Of course, it is possible to easily adjust the thermal expansion coefficient of each of the layers 141, 142, 143, and 144 by adjusting the quantities of the resin base 74 and the carbon fibers 741, 742, 743, and 744 included in the layers 141, 142, 143, and 144.

Figure 11:
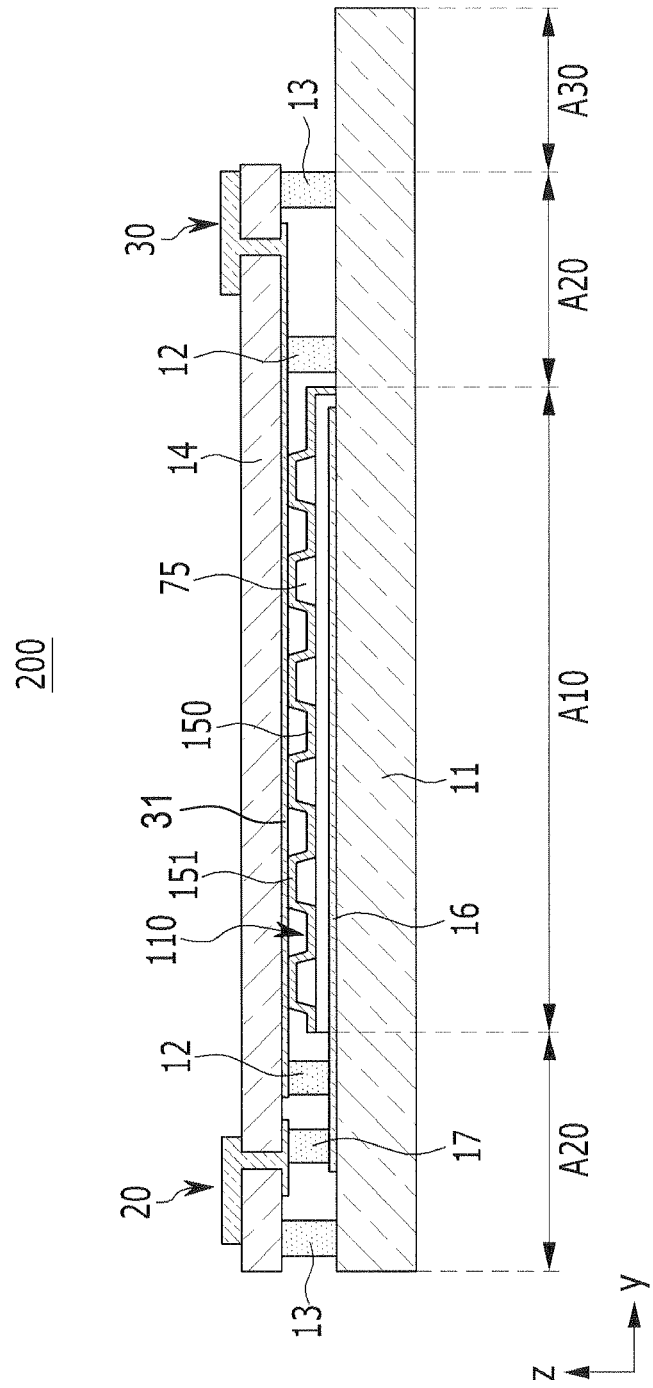
FIG. 11 is a schematic cross-sectional view of an organic light emitting diode display device constructed with a second embodiment.
Figure 12:
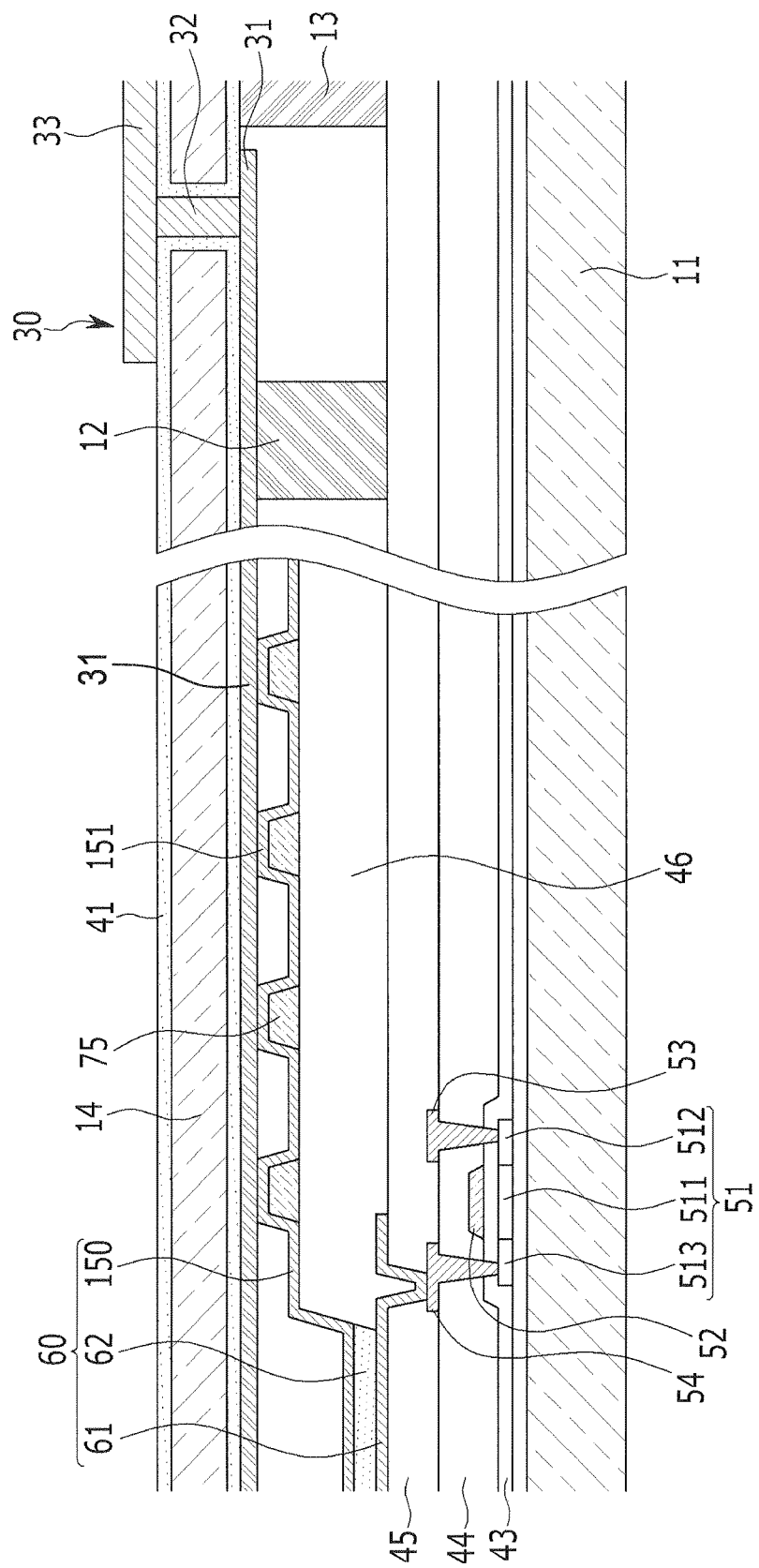
FIG. 12 is a partially enlarged diagram of the organic light emitting diode display device shown in FIG. 11.

FIG. 11 is a schematic cross-sectional view of an organic light emitting diode display device constructed with a second embodiment and FIG. 12 is a partially enlarged diagram of the organic light emitting diode display device shown in FIG. 11.

Referring to FIGS. 11 and 12, the organic light emitting diode display device 200 of the second exemplary embodiment has a similar configuration as the organic light emitting diode display device of the first embodiment except for a configuration in which the second pad section is omitted and the second internal layer 31 formed on the sealing substrate 14 is in contact with the common electrode 150. The same members as the first embodiment refer to the same reference numerals.

In the display unit 110, the common electrode 150 has an uneven structure, that is, a plurality of protrusions 151 and the protrusions 151 are in close contact with the second internal layer 31 formed on the sealing substrate 14. Therefore, the common electrode 150 is directly connected with the second conductive unit 30 without passing through the conductive bonding layer to be applied with the second signal therefrom.

The uneven structure of the common electrode 150 may be implemented by a spacer 75. For example, a plurality of spacers 75 are formed on the pixel defined layer 46 and the common electrode 150 may be formed in the entirety of the display area A10 while covering the plurality of spacers 75. The common electrode 150 is in close contact with the second internal layer 31 to be electrically connected with the second conductive unit 30 when the substrate 11 and the sealing substrate 14 are bonded to each other under a pressing condition.

Figure 13:
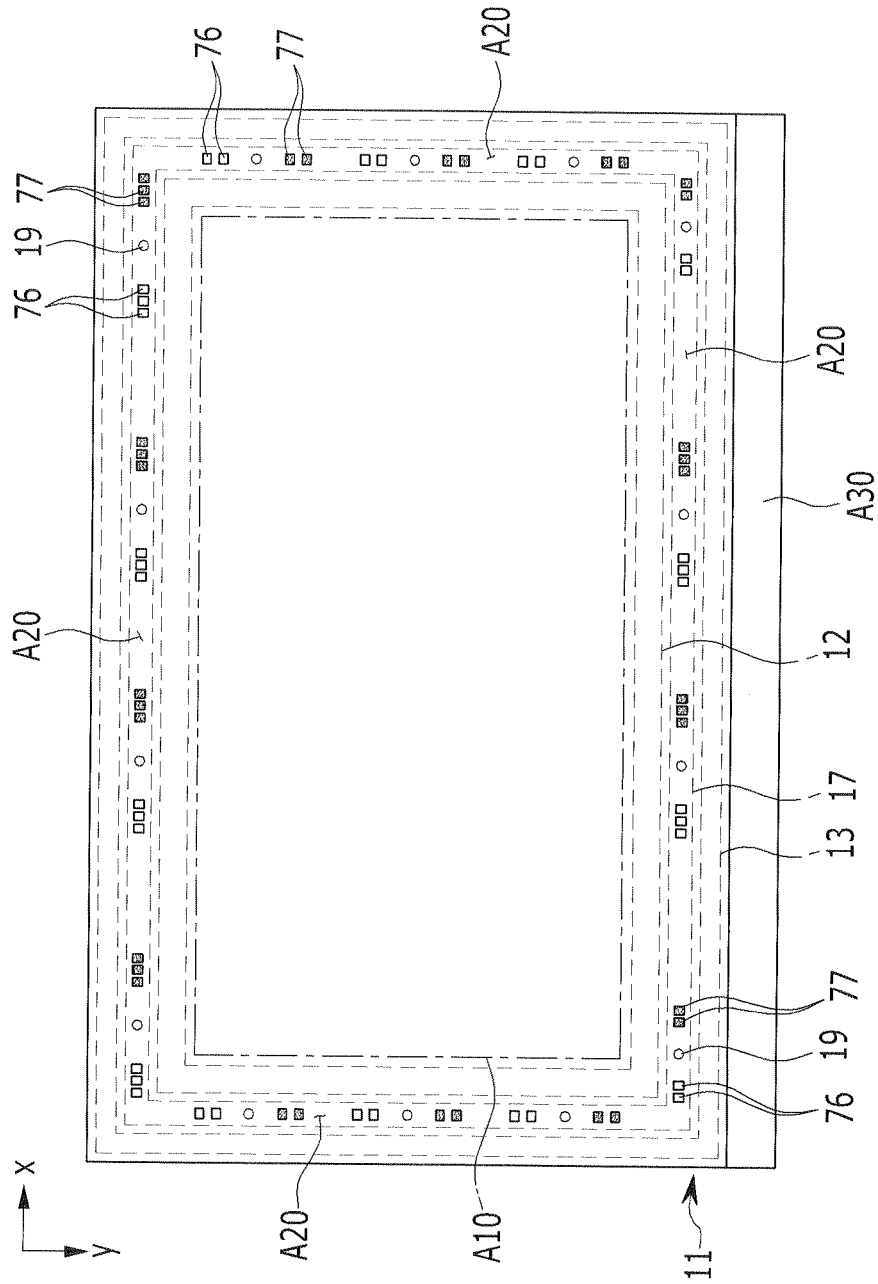
FIG. 13 is a plan view of a substrate in an organic light emitting diode display device constructed with a third embodiment.
Figure 14:
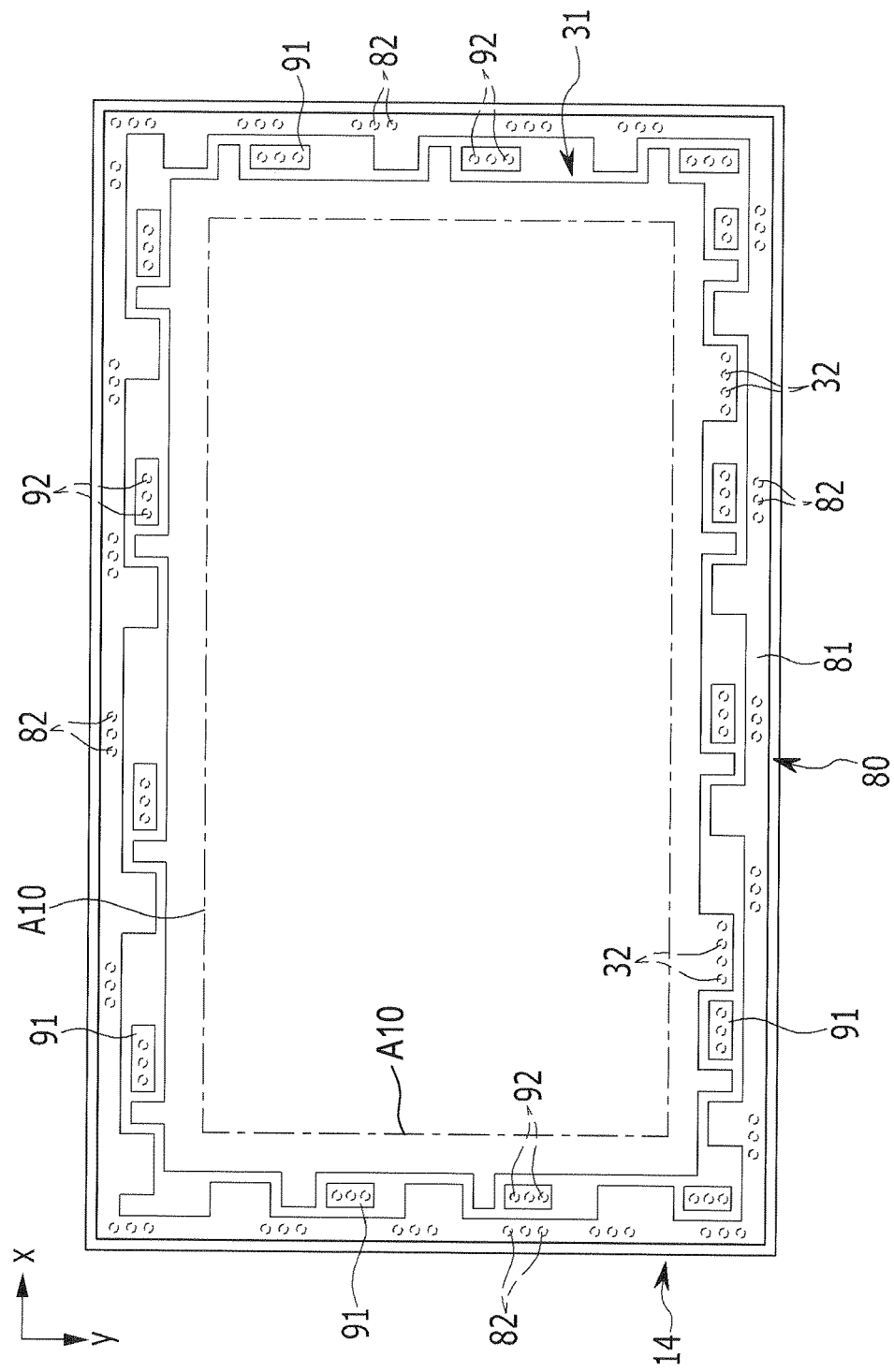
FIG. 14 is a plan view illustrating an inner surface of a sealing substrate in the organic light emitting diode display device constructed with the third embodiment.

FIG. 13 is a plan view of a substrate in an organic light emitting diode display device constructed with a third embodiment and FIGS. 14 and 15 are plan views illustrating an inner surface and an outer surface of a sealing substrate in the organic light emitting diode display device constructed with the third embodiment of FIG. 13, respectively.

Referring to FIG. 13, in the organic light emitting diode display device 300 of the third embodiment, the first common power supply line is divided into a first odd number-th common power supply line and a first even number-th common power supply line, and the second common power supply line is divided into a second odd number-th common power supply line and a second even number-th common power supply line. The first odd number-th common power supply line and the second odd number-th common power supply line are applied with a third signal and the first even number-th common power supply line and the second even number-th common power supply line are applied with a fourth signal. Such a structure is in use for driving interlace scanning.

The first pad section for the common power supply line formed on the substrate 11 includes a third pad section 76 for the first odd number-th common power supply line and the second odd number-th common power supply line and a fourth pad section 77 for the first even number-th common power supply line and the second even number-th common power supply line. The third pad section 76 and the fourth pad section 77 are alternately and repetitively disposed in a horizontal direction and a vertical direction of the substrate 11. In addition, the second pad section 19 for the common electrode is positioned between the third pad section 76 and the fourth pad section 77 in four wire and sealing areas A20.

In FIG. 13, the second pad section 19 is shown in a circular shape in order to discriminate the second pad section 19 from the third pad section 76 and the fourth pad section 77 and the fourth pad section 77 is shown as a dot pattern. The second pad section 19 and the third pad section 76 and the fourth pad section 77 shown in FIG. 13 are schematized and the positions and the number thereof are not limited to the shown example.

Referring to FIGS. 14 and 15, the first conductive unit includes a third conductive unit 80 for the first odd number-th common power supply line and the second odd number-th common power supply line and a fourth conductive unit 90 for the first even number-th common power supply line and the second even number-th common power supply line. The sealing substrate 14 includes a third through-hole for the third conductive unit 80 and a fourth through-hole for the fourth conductive unit 90.

The third conductive unit 80 includes a third internal layer 81 formed on the inner surface of the sealing substrate 14, a third connector 82 which is in contact with the third internal layer 81 and extends through the third through-hole, and a third external layer 83 which is in contact with the third connector 82 and is formed on the outer surface of the sealing substrate 14. The fourth conductive unit 90 includes a fourth internal layer 91 formed on the inner surface of the sealing substrate 14, a fourth connector 92 which is in contact with the fourth internal layer 91 and extends through the fourth through-hole, and a fourth external layer 93 which is in contact with the fourth connector 92 and is formed on the outer surface of the sealing substrate 14.

The second internal layer 31, the third internal layer 81, and the fourth internal layer 91 are spaced apart from each other by a predetermined distance on the inner surface of the sealing substrate 14. The second external layer 33, the third external layer 83, and the fourth external layer 93 are spaced apart from each other by a predetermined distance on the outer surface of the sealing substrate 14.

The second internal layer 31 is overlapped with the second pad section 19 of the substrate 11 and is in contact with the conductive bonding layer 17. The third internal layer 81 is overlapped with the third pad section 76 of the substrate 11 and is in contact with the conductive bonding layer 17. The fourth internal layer 91 is overlapped with the fourth pad section 77 of the substrate 11 and is in contact with the conductive bonding layer 17. At this time, the second internal layer 31 extends to the center of the sealing substrate 14 to face the display unit 110 and may be overlapped with the first bonding layer 12.

The third internal layer 81 and the fourth internal layer 91 are positioned outside of the second internal layer 31 and any one of the third internal layer 81 and the fourth internal layer 91, for example, the third internal layer 81 may be positioned at four edges of the sealing substrate 14. In this case, the fourth internal layer 91 are divided into plural numbers between the second internal layer 31 and the third internal layer 81.

The third external layer 83 may be positioned at fourth edges of the sealing substrate 14, the fourth external layer 93 may be positioned in parallel to the third external layer 83, and the fourth external layer 93 may be surrounded by the third external layer 83. The third external layer 83 and the fourth external layer 93 have a quadrangular frame shape, and the second external layer 33 are divided into plural numbers between the third external layer 83 and the fourth external layer 93.

The third external layer 83 may be thicker than the third internal layer 81, and the fourth external layer 93 may be thicker and wider than the fourth internal layer 91 to be usefully applied to the large-sized organic light emitting diode display device having large current capacity.

In the above-mentioned third embodiment, the third conductive unit 80 may be the fourth conductive unit 90 and the fourth conductive unit 90 may be the third conductive unit 80. That is, the third conductive unit 80 having the above-mentioned configuration may be a conductive unit for the first even number-th common power supply line and the second even number-th common power supply line, and the fourth conductive unit 90 having the above-mentioned configuration may be a conductive unit for the first odd number-th common power supply line and the second odd number-th common power supply line.

The organic light emitting diode display device 300 of the third embodiment has a similar configuration as the organic light emitting diode display device of the first embodiment except for the above-mentioned configuration.

Figure 16A:
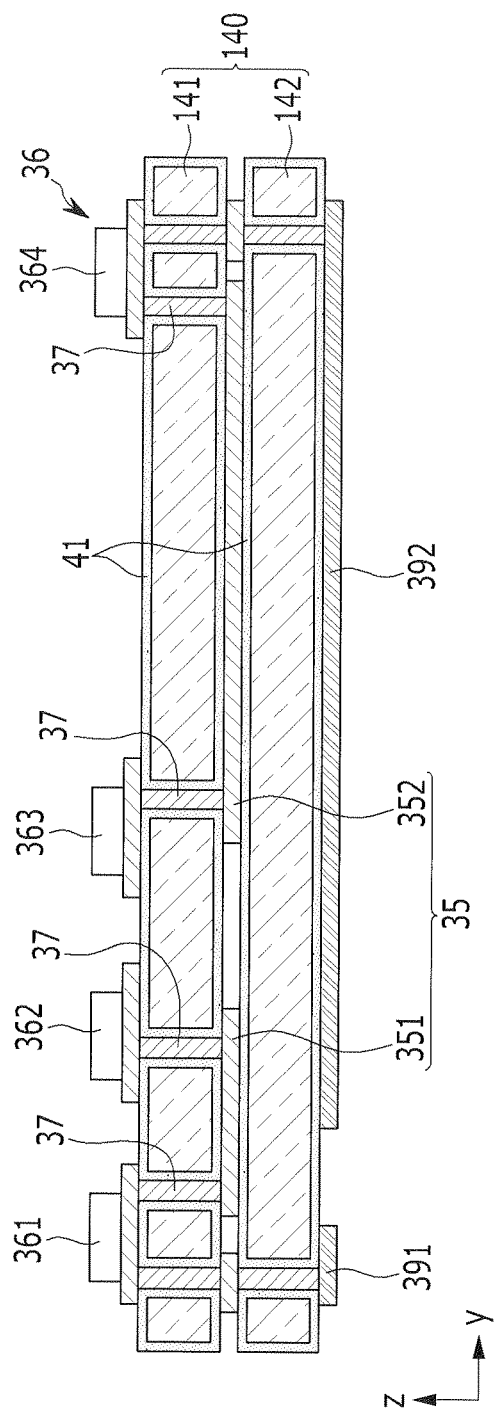
FIGS. 16A and 16B are cross-sectional views of a sealing substrate in an organic light emitting diode display device constructed with a fourth embodiment.
Figure 16B:
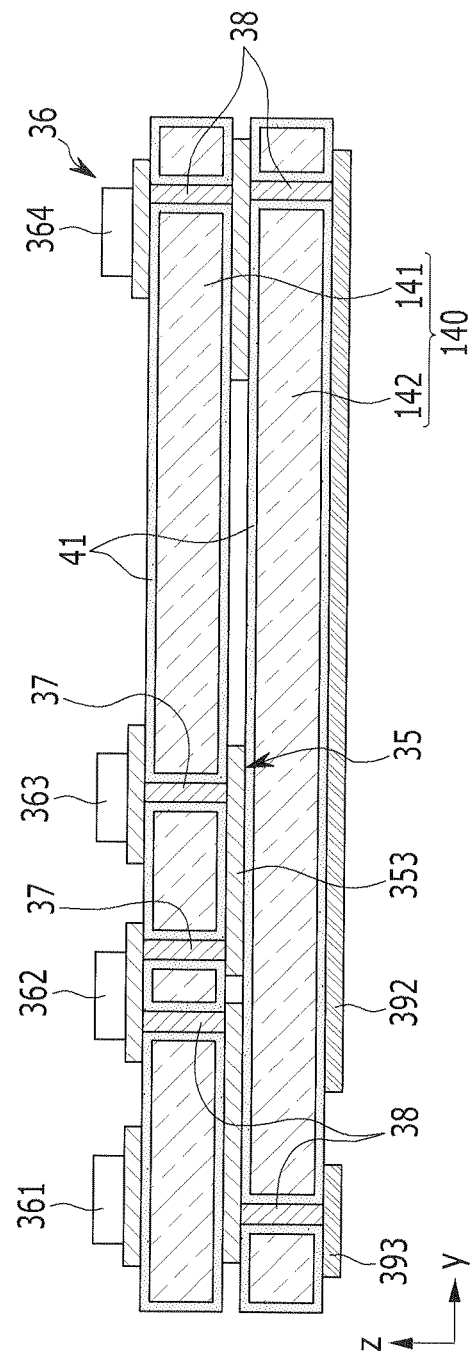

FIGS. 16A and 16B are cross-sectional views of a sealing substrate in an organic light emitting diode display device according to a fourth embodiment. FIGS. 16A and 16bB show cross sections acquired by cutting the same sealing substrate at different positions.

Referring to FIGS. 16A and 16B, the organic light emitting diode display device constructed with the fourth embodiment has a configuration similar to any one of the first to third embodiments described above except that a plurality of wire layers 35 are positioned in the sealing substrate 140 and a plurality of electronic elements 36 are mounted on the outer surface of the sealing substrate 140. In FIGS. 16A and 16B, only the sealing substrate 140 is shown for convenience and a detailed description of duplicate contents with the embodiments will be omitted.

In the organic light emitting diode display device of the fourth embodiment, the sealing substrate 140 are configured by a plurality of layers and each of the layers is surrounded by the insulating layer 41. Although a case in which the sealing substrate 140 includes the first layer 141 and the second layer 142 is shown as an example in FIGS. 16A and 16B, the number of the layers constituting the sealing substrate 140 is not limited to the shown example. Each of the first layer 141 and the second layer 142 may include a resin base and a plurality of carbon fibers, and the carbon fibers of the first layer 141 and the carbon fibers of the second layer 142 may cross each other.

The plurality of electronic elements 36 are mounted on the outer surface of the first layer 141 positioned furthest from the display unit (see reference numeral 110 in FIG. 1). At least two electronic elements of the plurality of electronic elements 36 share one wire layer 35 by a fifth connector 37 penetrating the first layer 141 and are thus connected through the wire layer 35. In addition, at least one electronic element of the plurality of electronic elements 36 is connected with metallic films 391, 392, and 393 corresponding thereto by a sixth connector 38 penetrating the first layer 141 and the second layer 142.

In FIGS. 16A and 16B, four electronic elements 36 are shown as an example. The electronic elements may be an embedded signal unit 361, an integrated circuit 362, passive components 363 such as a capacitor and a resistor, and a power signal unit 364. The integrated circuit 362 is connected with each of the embedded signal unit 361, the passive components 363, and the power signal unit 364, and the passive components 363 may be connected with the power signal unit 364.

In FIGS. 16A and 16B, a first wire layer 351 connecting the embedded signal unit 361 and the integrated circuit 362, a second wire layer 352 connecting the passive components 363 and the power signal unit 364, and a third wire layer 353 connecting the integrated circuit 362 and the passive components 363 are shown as an example.

The passive components 363 are used to generate voltages required to operate the integrated circuit 362 and the integrated circuit 362 may include a level shifter that shifts an embedded signal to a voltage level suitable for driving the display unit. The embedded signal unit 361, the power signal unit 364, and the integrated circuit 362 may be connected to the metallic films 391, 392, and 393 corresponding thereto, respectively.

A driving signal of the embedded signal unit 361, a power voltage of the power signal unit 364, and the signal shifted by the integrated circuit 362 are applied to the display unit through the corresponding metallic films 391, 392, and 393, and a conductive bonding layer (not shown). In this case, pad sections (not show) corresponding to the embedded signal unit 361, the power signal unit 364, and the integrated circuit 362, respectively are formed in parts on the outer surface of the display unit connected with the conductive bonding layer (not shown).

Types of the electronic elements 36 and the position of the wire layer 35 are not limited to the above-mentioned example and may be changed variously. For example, all the electronic elements required to drive the display unit may be mounted on the sealing substrate 140. In this case, the sealing substrate 140 may substitute for a flexible printed circuit (FPC) and a printed circuit board (PCB) in the related art.

While this disclosure has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A display device, comprising:
a substrate;
a display unit disposed on the substrate;
a sealing substrate bonded to the substrate by a bonding layer which surrounds the display unit, the sealing substrate comprising a resin base and a plurality of carbon fibers, and the sealing substrate comprising a through-hole;
a metallic film positioned on one surface of the sealing substrate and the one surface facing the substrate; and
an electrically conductive connector extending through the through-hole and contacting the metallic film.

2. The display device of claim 1, wherein:
the plurality of carbon fibers cross each other in the resin base.

3. The display device of claim 1, wherein:
the sealing substrate is constituted by a plurality of layers, and
each of the plurality of layers includes the resin base and the carbon fiber.

4. The display device of claim 3, wherein:
the carbon fiber disposed on at least one layer of the plurality of layers and the carbon fiber disposed on another layer of the plurality of layers cross each other.

5. The display device of claim 1, wherein:
the metallic film includes a plurality of metallic films which are spaced apart from each other,
the connector includes a plurality of connectors corresponding to the plurality of metallic films, respectively, and
each metallic film is applied with an independent signal through each corresponding connector.

6. The display device of claim 5, wherein:
an insulating layer is disposed on an inner surface of the sealing substrate and a side wall of the through-hole, and
the plurality of metallic films and the plurality of connectors are positioned on the insulating layer.

7. The display device of claim 3, wherein:
each of the plurality of layers is surrounded by an insulating layer and wire layers are positioned among the plurality of layers.

8. The display device of claim 7, wherein:
a plurality of electronic elements are mounted on an outer surface of a layer which is disposed furthest from the display unit among the plurality of layers.

9. The display device of claim 8, wherein:
at least two electronic elements of the plurality of electronic elements are electrically connected to each other through the wire layers, and at least one electronic element is electrically connected with the metallic film through the electrically conductive connector.

10. An organic light emitting diode display device, comprising:
a substrate;
a display unit formed on the substrate, and the display unit comprising a common power supply line and a common electrode;
a sealing substrate attached to the substrate by a bonding layer which surrounds the display unit, the sealing substrate comprising a resin base and a carbon fiber, and the sealing substrate comprising a first through-hole and a second through-hole;
a first conductive unit formed on an inner surface and an outer surface of the sealing substrate through the first through-hole, and the first conductive unit supplying a first signal to the common power supply line; and
a second conductive unit formed on both the inner surface and the outer surface of the sealing substrate through the second through-hole, and the second conductive unit supplying a second signal to the common electrode.

11. The display device of claim 10, further comprising:
an insulating layer formed on the inner surface and the outer surface of the sealing substrate, the side wall of the first through-hole, and the side wall of the second through-hole,
wherein the first conductive unit and the second conductive unit are disposed on the insulating layer.

12. The display device of claim 11, wherein:
the second conductive unit includes a second internal layer which is in contact with the bonding layer on the inner surface of the sealing substrate and faces the display unit, and the first conductive unit includes a first internal layer which is spaced apart from the second internal layer by a predetermined distance and is positioned outside of the second internal layer.

13. The display device of claim 12, wherein:
the second internal layer is formed by any one of an aluminum film, an aluminum alloy film, a copper film, and a copper alloy film.

14. The display device of claim 12, wherein:
the first conductive unit further comprises a first connector which is in contact with the first internal layer while extending through the first through-hole and a first external layer which is in contact with the first connector and is positioned on the outer surface of the sealing substrate, and
the first external layer is larger than the first internal layer in at least one of width and thickness.

15. The display device of claim 12, wherein:
the second conductive unit further comprises a second connector which is in contact with the second internal layer while extending through the second through-hole and a second external layer which is in contact with the second connector and is positioned on the outer surface of the sealing substrate, and
the second external layer is thicker than the second internal layer.

16. The display device of claim 10, wherein:
the common power supply line comprises a first common power supply line and a second common power supply line which cross each other.

17. The display device of claim 16, wherein:
the first conductive unit comprises a third conductive unit which is connected with a first odd number-th common power supply line and a second odd number-th common power supply line to supply a third signal to the first common power supply line and the second common power supply line, and a fourth conductive unit which is connected with a first even number-th common power supply line and a second even number-th common power supply line to supply a fourth signal to the first common power supply line and the second common power supply line.

18. An organic light emitting diode display device, comprising:
a substrate;
a display unit formed on the substrate, and the display unit comprising a common power supply line and a common electrode;
a pad section positioned outside of the display unit, and the pad section comprising a first pad section which is connected with the common power supply line and a second pad section which is connected with the common electrode;
a sealing substrate attached to the substrate by a bonding layer which surrounds the display unit, the sealing substrate comprising a resin base and a carbon fiber and comprising a first through-hole and a second through-hole;
a first conductive unit formed on an inner surface and an outer surface of the sealing substrate through the first through-hole, and the first conductive unit supplying a first signal to the common power supply line;
a second conductive unit formed on both the inner surface and the outer surface of the sealing substrate through the second through-hole, and the second conductive unit supplying a second signal to the common electrode; and
an electrically conductive bonding layer positioned between the first pad section and the first conductive unit and between the second pad section and the second conductive unit, the electrically conductive bonding layer electrically connecting the first pad section to the first conductive unit and electrically connecting the second pad section to the second conductive unit.

19. The display device of claim 18, wherein:
the common power supply line includes a first common power supply line and a second common power supply line which cross each other, and
the first pad section and the second pad section are alternately and repetitively disposed in one direction of the substrate.

20. The display device of claim 19, wherein:
the conductive bonding layer shows an electrical conductivity in a thickness direction, shows an electrical insulativity in directions other than the thickness direction, and is overlapped with the first pad section and the second pad section.

21. The display device of claim 20, wherein:
the first conductive unit comprises a first internal layer which is overlapped with the first pad section and is in contact with the conductive bonding layer, a first external layer positioned on the outer surface of the sealing substrate, and a first connector which extends through the first through-hole and connects the first internal layer and the first external layer with each other, and
the second conductive unit comprises a second internal layer which is overlapped with the second pad section and is in contact with the conductive bonding layer, a second external layer positioned on the outer surface of the sealing substrate, and a second connector which extends through the second through-hole and connects the second internal layer and the second external layer with each other.

22. The display device of claim 21, wherein:
the second internal layer extends to the center of the sealing substrate to face the display unit, and
the first internal layer is disposed outside of the second internal layer and is spaced apart from the second internal layer by a predetermined distance.

23. The display device of claim 21, wherein:
the first external layer is positioned at at least three edges of the sealing substrate, and
the second external layer is positioned at the rest edges of the sealing substrate.

24. The display device of claim 20, wherein:
the first conductive unit comprises a third conductive unit which is connected with a first odd number-th common power supply line and a second odd number-th common power supply line to supply a third signal to the first common power supply line and the second common power supply line, and a fourth conductive unit which is connected with a first even number-th common power supply line and a second even number-th common power supply line to supply a fourth signal to the first common power supply line and the second common power supply line.

25. The display device of claim 24, wherein:
the first pad section comprises a third pad section connected with the first odd number-th common power supply line and the second odd number-th common power supply line and a fourth pad section which is connected with the first even number-th common power supply line and the second even number-th common power supply line, the first through-hole comprises a third through-hole for passing the third conductive unit and a fourth through-hole for passing the fourth conductive unit.

26. The display device of claim 25, wherein:
the third conductive unit comprises a third internal layer which is overlapped with the third pad section and is in contact with the conductive bonding layer, a third external layer positioned on the outer surface of the sealing substrate, and a third connector which connects the third internal layer and the third external layer with each other while extending through the third through-hole, and
the fourth conductive unit comprises a fourth internal layer which is overlapped with the fourth pad section and is in contact with the conductive bonding layer, a fourth external layer positioned on the outer surface of the sealing substrate, and a fourth connector which connects the fourth internal layer and the fourth external layer with each other while extending through the fourth through-hole.

27. The display device of claim 26, wherein:
the second internal layer extends to the center of the sealing substrate and faces the display unit,
the third internal layer and the fourth internal layer are positioned outside of the second internal layer, and
any one of the third internal layer and the fourth internal layer is positioned at four edges of the sealing substrate.

28. The display device of claim 26, wherein:
the third external layer is positioned at four edges of the sealing substrate,
the fourth external layer is positioned in parallel to the third external layer outside or inside of the third external layer, and
the second external layer is positioned between the third external layer and the fourth external layer.

29. The display device of any one of claim 18, further comprising:
an insulating layer formed on the inner surface and the outer surface of the sealing substrate, and the side wall of the first through-hole and the side wall of the second through-hole,
wherein the first conductive unit and the second conductive unit are formed on the insulating layer.

30. An organic light emitting diode display device, comprising:
a substrate;
a display unit formed on the substrate, and the display unit comprising a common power supply line and a common electrode;
a sealing substrate attached to the substrate by a bonding layer which surrounds the display unit, the sealing substrate comprising a resin base and a carbon fiber, and the sealing substrate comprising a first through-hole and a second through-hole;
a first pad section disposed outside of the display unit and connected with the common power supply line;
a first conductive unit formed on an inner surface and an outer surface of the sealing substrate through the first through-hole, and the first conductive unit connected with the first pad section by an electrically conductive bonding layer to supply a first signal to the common power supply line; and
a second conductive unit formed on both the inner surface and the outer surface of the sealing substrate through the second through-hole, and the second conductive being in directly physical contact with the common electrode to supply a second signal to the common electrode.

31. The display device of claim 30, wherein:
the second conductive unit comprises a second internal layer which is in directly physical contact with the common electrode, a second external layer positioned on the outer surface of the sealing substrate, and a second connector which extends through the second through-hole and connects the second internal layer and the second external layer with each other.

32. The display device of claim 31, wherein:
the common electrode includes a plurality of protrusions, and
the second internal layer is in directly physical contact with the protrusions.

33. The display device of claim 32, further comprising:
a plurality of spacers positioned below the common electrode,
wherein each protrusion is provided to correspond to each spacer.

34. The display device of claim 31, wherein:
the second internal layer has a larger area than the display unit, and
the second internal layer is formed by any one of an aluminum film, an aluminum alloy film, a copper film, and a copper alloy film.

35. The display device of claim 30, wherein:
the first conductive unit comprises a first internal layer which is overlapped with the first pad section and is in contact with the conductive bonding layer, a first external layer positioned on the outer surface of the sealing substrate, and a first connector which extends through the first through-hole and connects the first internal layer and the first external layer with each other.

36. The display device of any one of claim 30, further comprising:
an insulating layer formed on the inner surface and the outer surface of the sealing substrate, and the side wall of the first through-hole and the side wall of the second through-hole,
wherein the first conductive unit and the second conductive unit are formed on the insulating layer.

* * * * *